United States Patent
Bains et al.

(10) Patent No.: US 12,321,634 B2
(45) Date of Patent: Jun. 3, 2025

(54) DOUBLE FETCH FOR LONG BURST LENGTH MEMORY DATA TRANSFER

(71) Applicant: Intel Corporation, Santa Clara, CA (US)

(72) Inventors: Kuljit S. Bains, Olympia, WA (US); Bill Nale, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 855 days.

(21) Appl. No.: 17/336,996

(22) Filed: Jun. 2, 2021

(65) Prior Publication Data

US 2021/0286561 A1    Sep. 16, 2021

(51) Int. Cl.
*G06F 3/06* (2006.01)

(52) U.S. Cl.
CPC .......... *G06F 3/0659* (2013.01); *G06F 3/0605* (2013.01); *G06F 3/0653* (2013.01); *G06F 3/0673* (2013.01)

(58) Field of Classification Search
CPC .... G06F 3/0659; G06F 3/0605; G06F 3/0653; G06F 3/0673; G06F 13/4243; G11C 7/106; G11C 8/12; G11C 7/1042; G11C 7/1087; G11C 7/1093; G11C 7/1039; G11C 2207/107; G11C 2207/108; G11C 2207/2281; G11C 2207/229; G11C 7/1018; G11C 11/4076; G11C 11/4091; G11C 7/1066; G11C 7/22; G11C 11/408
See application file for complete search history.

(56) References Cited

U.S. PATENT DOCUMENTS

| | | | |
|---|---|---|---|
| 2005/0047264 A1 | 3/2005 | Lee | |
| 2007/0162668 A1* | 7/2007 | Shaeffer | G06F 13/4243 710/68 |
| 2014/0156948 A1 | 6/2014 | Roberts et al. | |
| 2014/0325105 A1 | 10/2014 | Prete et al. | |
| 2016/0163376 A1 | 6/2016 | Bains et al. | |
| 2017/0286017 A1* | 10/2017 | Ware | G11C 7/22 |
| 2018/0033467 A1 | 2/2018 | Villa | |
| 2018/0095821 A1 | 4/2018 | Vogt | |

(Continued)

FOREIGN PATENT DOCUMENTS

KR    102079939 B1    2/2020

OTHER PUBLICATIONS

International Search Report and Written Opinion for PCT Patent Application No. PCT/US22/20646, Mailed Jun. 24, 2022, 11 pages.

(Continued)

*Primary Examiner* — Jason W Blust
(74) *Attorney, Agent, or Firm* — Compass IP Law PC

(57) ABSTRACT

For a memory device where a data fetch accesses N/2 data bits, and the memory device is to transfer N bits over a data burst of length M in response to a read command, the memory device accesses the same bank twice to access the N bits. Instead of accessing N/2 bits from two different banks, the memory device accesses a single bank twice. The memory device can control the timing of the data transfer to enable sending all N data bits to the memory controller for the read command. The memory device can send data as a first transfer of burst length M/2 of a first N/2 data bit portion and a second transfer of burst length M/2 of a second N/2 data bit portion.

24 Claims, 10 Drawing Sheets

(56) References Cited

U.S. PATENT DOCUMENTS

| | | |
|---|---|---|
| 2018/0254079 A1 | 9/2018 | Cox et al. |
| 2018/0276149 A1 | 9/2018 | Bains |
| 2019/0138245 A1 | 5/2019 | Shin et al. |
| 2019/0252009 A1 | 8/2019 | Kang et al. |
| 2020/0004420 A1 | 1/2020 | Gans et al. |
| 2021/0149565 A1 | 5/2021 | Gans et al. |
| 2022/0327078 A1* | 10/2022 | Tang ..................... G06F 13/404 |

OTHER PUBLICATIONS

Dutch and English Translation of the Examination Report for Patent Application No. 2031713, Mailed Feb. 7, 2023, 8 pages.

* cited by examiner

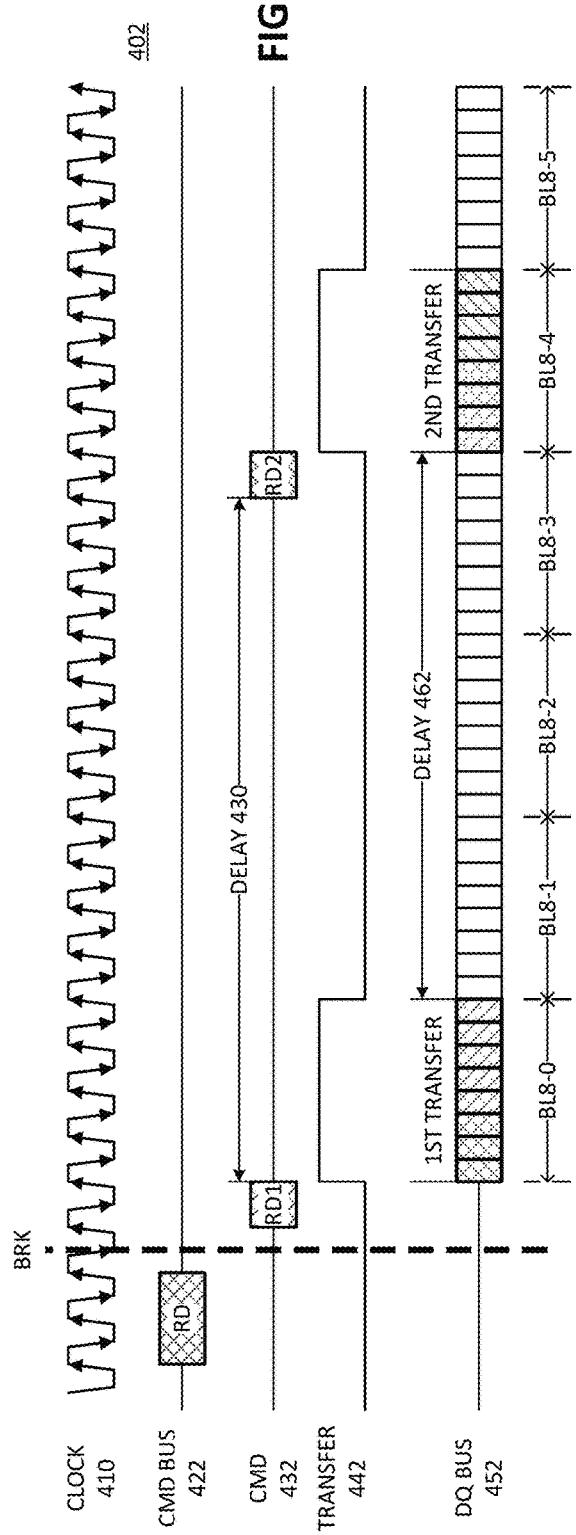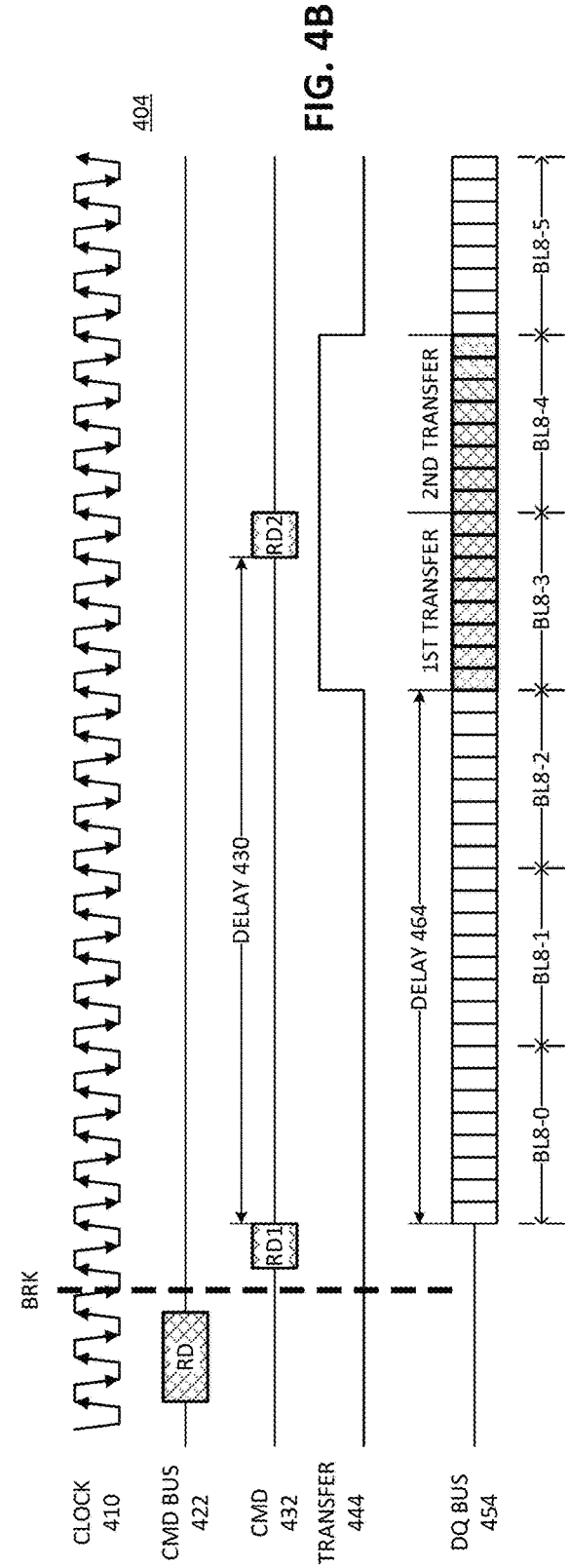

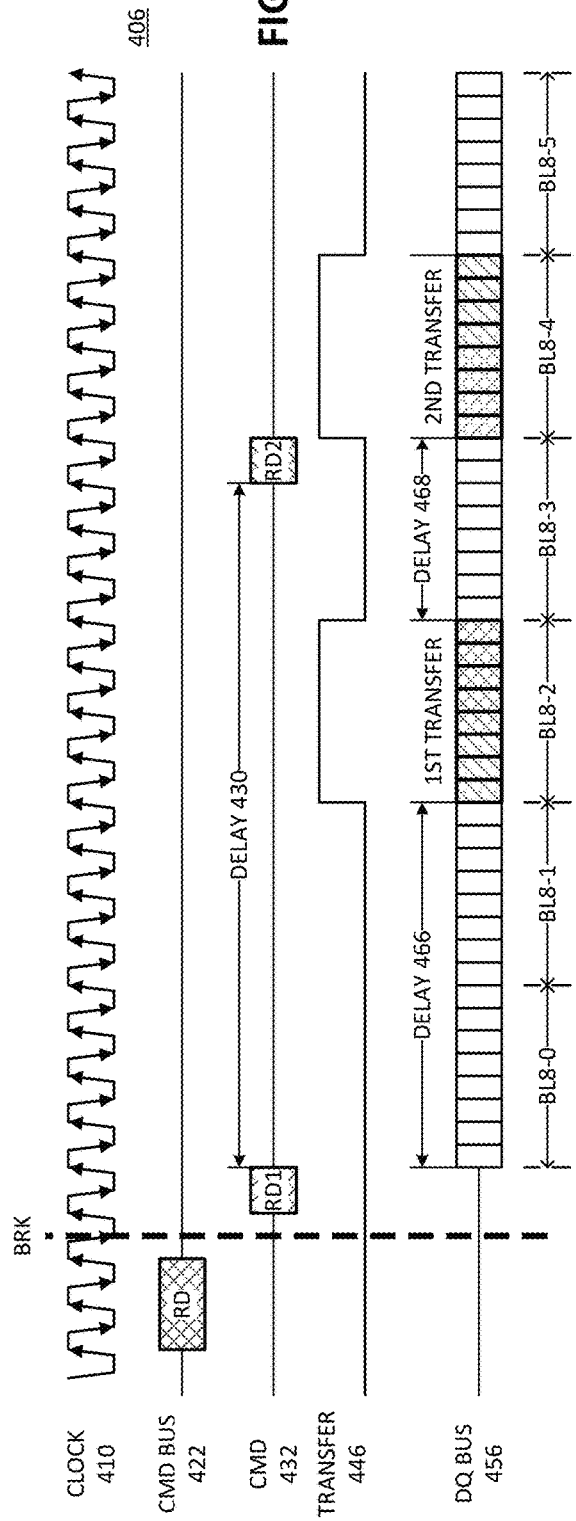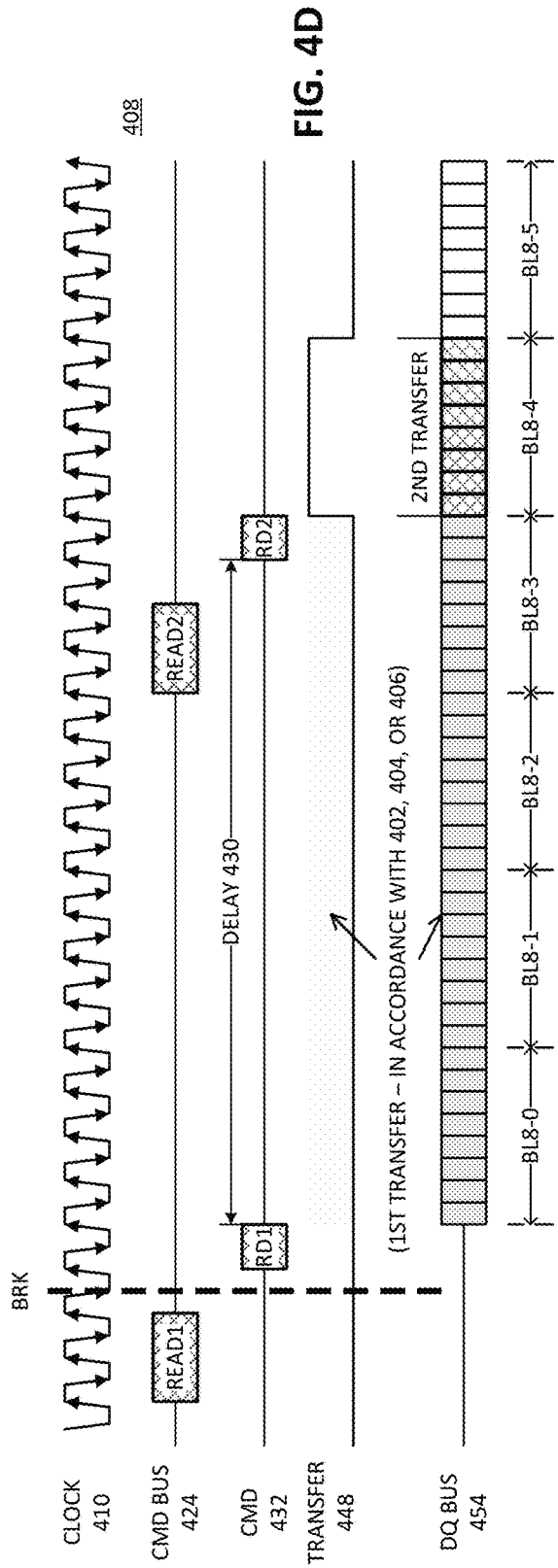

DOUBLE FETCH FOR LONG BURST LENGTH MEMORY DATA TRANSFER

FIELD

Descriptions are generally related to memory systems, and more particular descriptions are related to memory device data fetch.

BACKGROUND

Memory devices, such as dynamic random access memory (DRAM) devices, have a memory array arranged into banks and bank groups. The use of different banks is important for the performance of the memory device, to enable the system to access separately addressable and separately accessible portions of the memory device in parallel. With increasing data rates, transfer of data between the memory device and the host can be significantly faster than accessing the data out of the array.

Current DRAM devices may also have different configuration of signal lines to interface with the data bus. Common interfaces include x4 (four DQ (data) signal lines), x8 (eight DQ signal lines), and x16 (sixteen DQ signal lines). In current implementations, x16 devices use the memory array and signal lines as two x8 halves, with half of the data coming from one side and the other half of the data coming from the other side. Such an implementation effectively cuts the number of banks in half, reducing options for the host to perform access from parallel resources, and having a negative impact on system throughput.

The throughput issue is exacerbated by the fact that x16 devices are currently used only in single rank systems, which further reduces the ability of the host to interleave traffic to try to maintain maximum memory bandwidth utilization.

FIG. 1 is a block diagram of a prior art example of a system that fetches data from multiple banks in parallel. System 100 includes memory device 110 connected to host 120. An example of memory device 110 includes 32 banks organized as 8 bank groups (BG) of 4 banks per BG. When utilized as a x8 device, DQ[0:7] are used to provide a single channel with 8 BG by 4 banks available to the host for access. When utilized as a x16 device, memory device 110 has only one channel with DQ[0:15], with 4 BG by 4 banks available to the host (where two banks are used in parallel as a single bank resource). Thus, memory device 110 fetches data for a read from banks in different bank groups in parallel. As illustrated, if Bank[2] of BG[1] is selected, BG[5] is treated as part of BG[1], with the data for DQ[0:7] coming from BG[1] Bank[2], and data for DQ[8:15] coming from BG[5] Bank[2].

System 100 illustrates a burst of BL16 (burst length 16). Thus, 256 bits per read will be accessed from the array and sent from memory device 110 to host 120, with 128 bits fetched from each bank in parallel, and sent over half the total number of DQ signal lines. The need to access 128 bits of data from two banks in parallel to obtain the needed 256 bits for x16 by BL16 means host 120 will only see 16 separately addressable banks, reducing the resources available for parallel access.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIGS. 4A-4D are timing diagrams of examples of accessing data from a bank with multiple accesses and controls burst transfer timing.

Descriptions of certain details and implementations follow, including non-limiting descriptions of the figures, which may depict some or all examples, and well as other potential implementations.

DETAILED DESCRIPTION

As described herein, for a memory device where a data fetch accesses half as many bits as needed for a data transfer, the memory device accesses all bits from the same bank by two consecutive accesses instead of accessing half of the bits each from two parallel banks. In one example, the two consecutive accesses are read accesses. A read access refers to a read operation to read data from the memory array. A write access refers to a write operation to store data in the memory array.

A fetch accesses N/2 data bits and the total data transfer for a read is N data bits. The memory device can access the same bank twice to access the N data bits, and control the timing of the data transfer based on accessing the same bank twice. In response to a read command, the memory device will transfer N data bits over a data burst of length M, accessing all N data bits from the same bank with consecutive N/2 bit accesses to the bank, instead of accessing N/2 bits from two different banks. The memory device can control the timing of the data transfer to enable sending all N data bits to the memory controller for the read command. The memory device can send the data in two half portions of the full data burst. Thus, the memory device sends data as a first transfer of burst length M/2 of a first N/2 data bit portion and a second transfer of burst length M/2 of a second N/2 data bit portion. The two transfers can be consecutive, or can be interleaved with data from a different memory access transaction.

Figure 1:
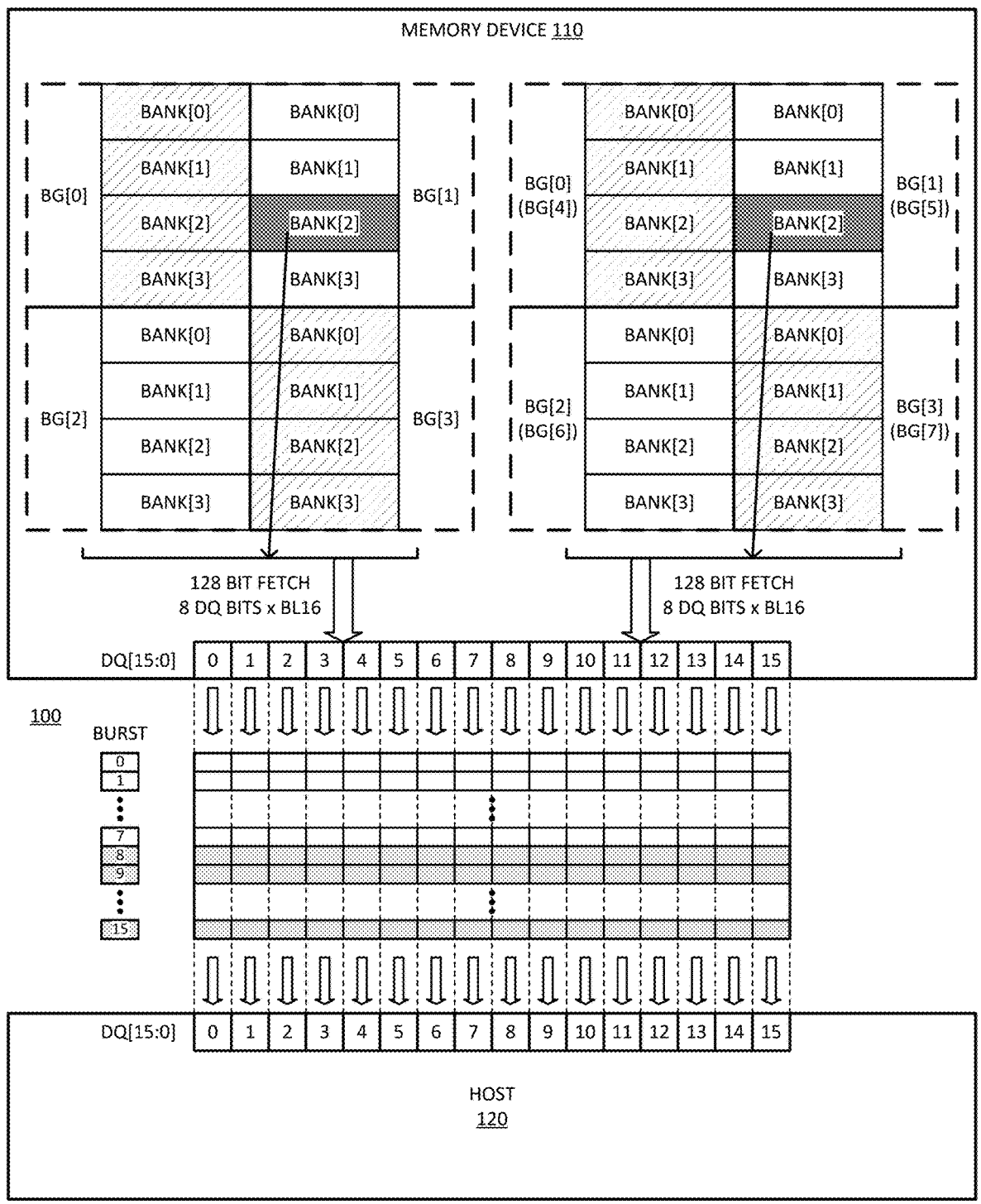
FIG. 1 is a block diagram of a prior art example of a system that fetches data from multiple banks in parallel.
Figure 2:
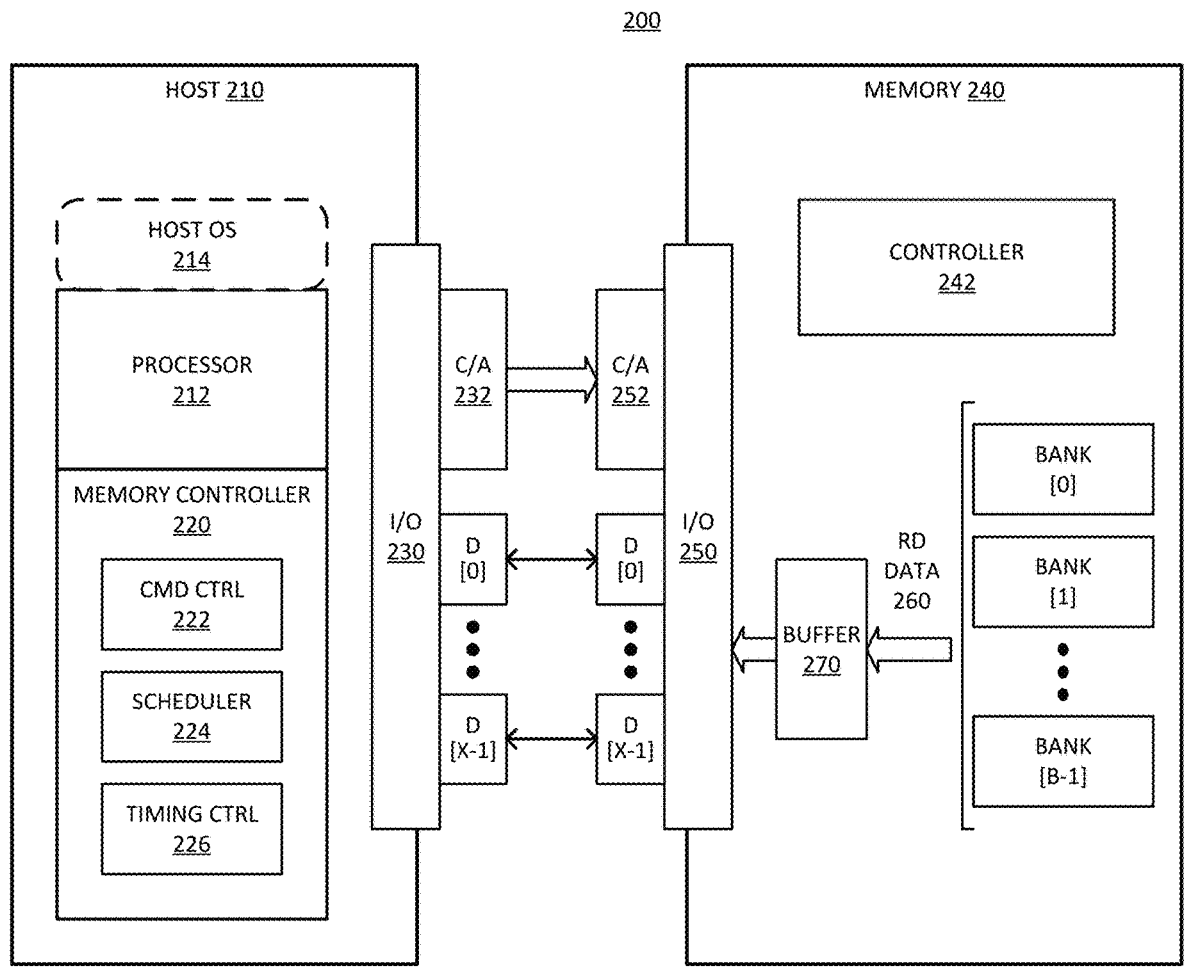
FIG. 2 is a block diagram of an example of a system in which data is accessed by multiple reads from a memory bank.

FIG. 2 is a block diagram of an example of a system in which data is accessed by multiple reads from a memory bank. System 200 illustrates memory coupled to a host. Host 210 represents a host computing system. Host 210 includes host hardware such as processor 212 and memory controller 220. The host hardware also includes hardware interconnects and driver/receiver hardware to provide the interconnection between host 210 and memory 240. Memory 240 includes parallel memory resources, Bank[0:B-1]. Memory controller 220 controls access to memory 240. In one example, memory 240 represents a low power double data rate (LPDDR) dynamic random access memory (DRAM) device.

The host hardware supports the execution of host software on host 210. The host software can include host OS (operating system) 214. Host OS 214 represents a software platform under which other software will execute. Host OS 214 provides control to enable interfacing with hardware interconnections to couple to memory devices 240.

During execution, host OS 214 provides requests to access memory. The requests can be directly from host OS software can be requests through APIs (application programming interfaces) or other mechanisms for a program executing under host OS 214 to request a memory access. In response to a host memory access request, memory controller 220 maps host-based addressing for memory resources to physical address locations of memory 240.

In one example, memory controller 220 includes command control (CMD CTRL) 222 to generate commands for access to memory 240. Memory controller 220 includes scheduler 224 to schedule the sending of commands generated by command control 222. In one example, scheduler 224 includes configuration or programming for scheduling commands based on timing for data transfer with memory 240, based on how memory 240 uses Banks[0:B-1] to store data. In one example, memory 240 accesses a single bank twice in response to a read command, or writes twice to a single bank in response to a write command. The delay used between data bursts can leave time periods in which data from other access transactions can be interleaved.

Scheduler 224 enables memory controller 220 to schedule read commands and other commands based on the timing when read data 260 will be received from memory 240 in response to the read commands. In one example, scheduler 224 will reorder commands based on the timing to ensure utilization of the data bus. In one example, scheduler 224 schedules commands to interleave data based on expected timing delays of sending partial data bursts by memory 240. In one example, scheduler 224 schedules commands based on write timing due to writing two portions of data to the same bank with back-to-back writes to the same bank in memory 240. The read command will be to a selected bank of memory 240, with the expectation that reads occur with two internal operations to fetch data twice within memory 240. Similarly, the write command will be to a selected bank of memory 240, with the expectation that writes occur with two internal operations to write data twice within memory 240. Scheduler 224 will schedule commands based on the timing delay used by memory 240 to return data in response to a read command. Scheduler 224 will schedule commands based on the timing delay memory 240 will incur to perform two internal writes in response to a write command.

System 200 illustrates timing control (CTRL) 226 in memory controller 220 to control the timing of sending the data bursts. In a traditional implementation, data accessed from the memory array in response to a read command is sent to the memory controller as soon as it is accessed. Thus, the data is ready to send when it is accessed, and it is sent as soon as it is ready, in a traditional implementation. Timing control 226 manages a delay in sending a burst by delaying when data accessed from the data array is sent, thus sending the data after some delay after the data would traditionally be ready to send. In one example, timing control 226 can manage a delay prior to sending the first data burst. In one example, timing control 226 can manage a delay prior to sending the second data burst. In one example, timing control 226 can manage a delay prior to sending the first data burst and manage a delay prior to sending the second data burst.

Host 210 includes I/O (input/output) 230 to interconnect with memory 240. Memory 240 includes corresponding I/O 250. C/A (command/address) 232 represents interface hardware including signal lines to enable memory controller 220 to send commands to memory 240. C/A 252 represents interface hardware including signal lines for memory 240 to receive commands issued by command control 222 of memory controller 220.

D[0:X-1] represent interface hardware including signal lines to enable host 210 and memory 240 to exchange data associated with a command. D[0:X-1] represent a data bus with X data (DQ) lines, where I/O 230 and I/O 250 include interfaces or interface hardware to the data bus. The interface hardware can be referred to as a data interface. C/A 232 and C/A 252 represent interfaces to a command bus, which can be referred to as command interfaces. For write commands, I/O 230 will drive the data bus. For read commands, I/O 250 will drive the data bus.

Memory 240 includes controller 242, which represents a controller or control logic or control hardware at the memory to receive and process commands from host 210. Controller 242 generates internal commands or internal operations to execute the commands received from memory controller 220. In response to a read command, controller 242 generates operations to access read (RD) data 260 from Banks[0:B-1].

Consider an example where memory 240 represents a dynamic random access memory (DRAM) device compatible with a double data rate version 5 (DDR5) or other DDR standard, where X equals 16. In such an example, memory 240 would represent a DDR5 x16 DRAM device. Traditionally, B equals 32, and Banks[0:31] (8 bank groups by 4 banks per bank group) would be available to memory controller 220 in x4 and x8 devices. In a traditional x16 device, memory controller 220 would only see 16 banks (4 bank groups by 4 banks per bank group) per device.

In contrast to the traditional x16 configuration, which suffers from limited performance due to only 16 banks being accessible to memory controller 220, in one example, memory 240 accesses the same bank twice to generate read data 260, and splits the data over separate bursts. The separate bursts enable memory 240 to control the timing of the output of read data 260. In one example, controller 242 controls the timing of either a first half of the output burst or the second half of the output burst.

The operation of memory 240 enables the use of a x16 configuration or other configuration that transfers more data per read command than is accessed by a fetch operation without suffering the traditional performance loss. Being able to use x16 devices without performance loss allows lower capacity system configurations, which can save cost. In one example, controller 242 can perform two consecutive fetches to the same bank to obtain the total amount of data needed for a data transfer in response to a read command. The ability to perform back to back fetches to the same bank for different halves of the total amount of data for the data transfer can enable system 200 to maintain all B banks instead of presenting B/2 banks to memory controller 220.

In one example, memory 240 performs a first fetch for N/2 bits of a total of N data bits. Controller 242 can generate the first fetch in response to a read command from memory controller 220. In one example, controller 242 also generates a second fetch operation in response to the read command, to cause the second fetch to the addressed bank after an appropriate same-bank timing delay (e.g., tCCD_L or CAS to CAS (column address strobe) delay, long). In one example, controller 242 only generates a single fetch operation in response to a read command, and memory controller 220 sends a second read command to cause the additional fetch from the same bank. It will be understood that such an operation would use additional memory channel bandwidth, which may be undesirable in some implementations.

In system 200, memory controller 220 can see all B banks even when a fetch only generates half the data needed for a data transfer. Referring to the example above, if X is 16 and B is 32, memory controller 220 would see all 32 banks, and controller 242 can manage two fetches from a select bank to obtain read data 260. Instead of sending the data in two bursts as soon as the data is accessed, controller 242 will manage the timing of one or both of two half-bursts to send read data 260 to memory controller 220.

With all banks available, the performance of system 200 is improved relative to systems that access data from banks in parallel, when controller 242 manages the data transfer bursts to improve bandwidth utilization. System 200 can have lower power relative to a traditional system implementation given that only half as many banks are activated per access.

In one example, memory 240 includes buffer 270 to buffer read data 260. It will be understood that depending on how controller 242 manages the timing of internal operations and the timing of the data bursts, buffer 270 can be optional. Buffer 270 can enable memory 240 to temporarily hold read data 260 to delay the timing of the first half burst of data. In one example, buffer 270 can be implemented with buffering in the data path that exists in current memory devices. Buffer 270 can allow controller 242 to manage the timing offset between the fetch and the transmit delay.

System 200 specifically illustrates read data 260. It will be understood that if a read results in two fetches from the same bank, a write transaction will result in two write operations to the same bank. In one example, memory controller 220 sends all write data consecutively, in consecutive burst (e.g., M transmission cycles). In such an implementation, memory 240 will include buffer 270 or other buffer to hold the write data to enable two consecutive internal write operations to the same bank. In one example, instead of sending all data at the same time, memory controller 220 sends the write data as two separate half bursts of data, similar to what is described with respect to memory 240 sending read data in two half bursts. To send data as two portions or two chunks, memory controller 220 will need to manage the timing of the sending of write data to memory 240. Such an implementation could add complexity to the scheduling of memory controller 220. In either implementation, whether controlling the timing of the second half of the data by memory controller 220, or sending all data at one time and having memory 240 buffer the write data, system 200 could result in a timing offset between read latency and write latency.

Figure 3A:
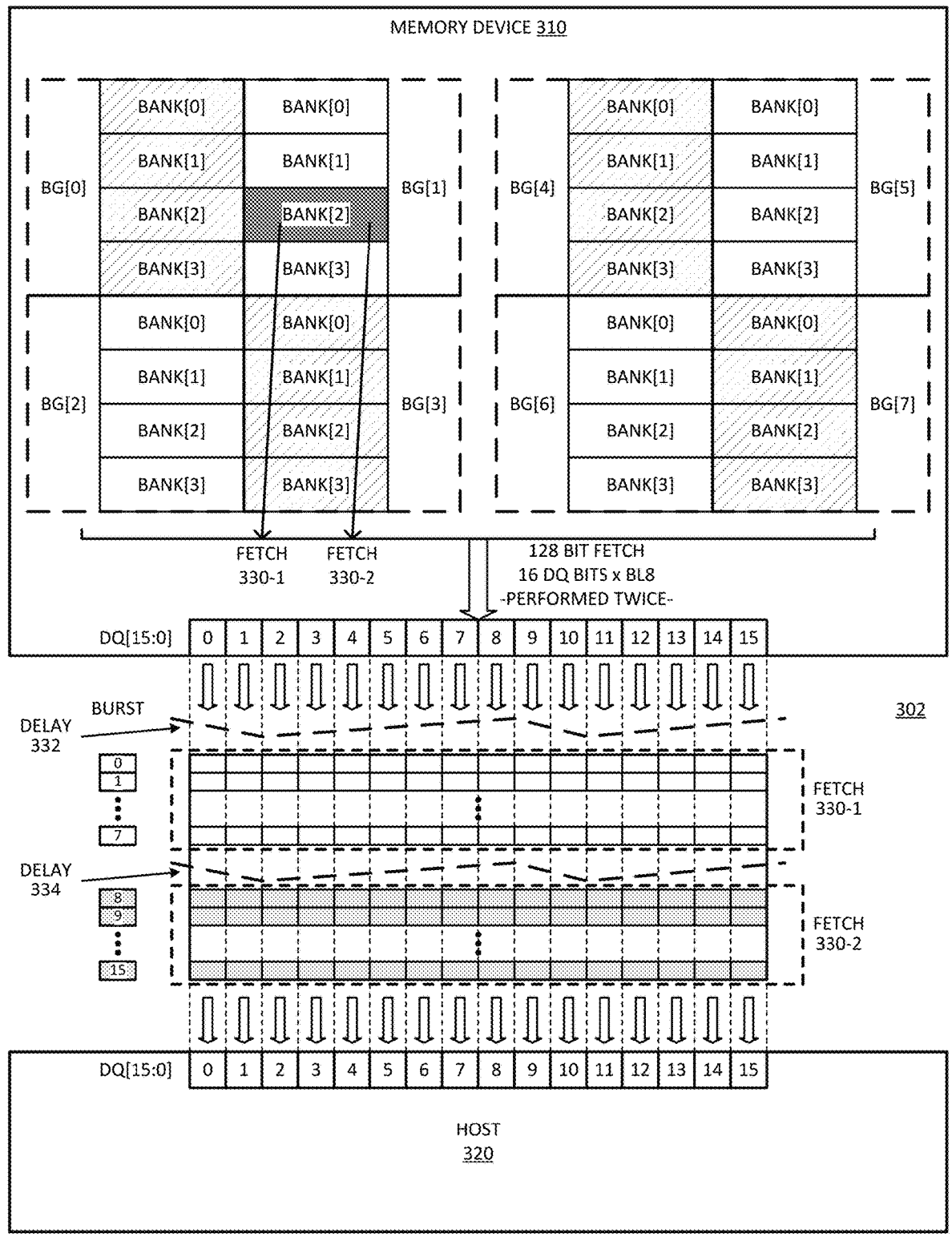
FIG. 3A is a block diagram of an example of a system that fetches data from a single bank with consecutive accesses for a read transaction.

FIG. 3A is a block diagram of an example of a system that fetches data from a single bank with consecutive accesses for a read transaction. System 302 illustrates a system in accordance with an example of system 200. System 302 includes memory device 310 connected to host 320. An example of memory device 310 includes 32 banks organized as 8 BG by 4 banks per BG.

When utilized as a x16 device, memory device 310 has 8 BG by 4 banks available to the host. The availability of the 32 banks is contrasted with a traditional x16 device architecture that only presents 16 banks to host 320. Performance of the memory can be directly related to the number of banks available to the memory controller of host 320, especially at higher data rates. The bank cycle times are very slow compared to the data transfer rates. Thus, multiple banks are accessed in parallel to allow cycling of the multiple banks in parallel, each offset in time from the others, to maintain the full data rate.

Memory device 310 fetches data for a read from a single bank by accessing the bank twice in response to a single read command from host 320. As illustrated, if Bank[2] of BG[1] is selected, only that bank is accessed, by fetch 330-1 and 330-2, in contrast to a traditional approach as shown in system 100, where BG[5] would be treated as part of BG[1]. Thus, in system 302, the data for DQ[0:15] comes from BG[1] Bank[2], with the data bits for the first 8 cycles (BL [0:7], the first half of the burst) accessed with fetch 330-1 and the data bits for the second 8 cycles (BL [8:15], the second half of the burst) accessed with fetch 330-2.

System 302 illustrates a burst of BL16, with optional delay 332 before the first half of the burst and optional delay 334 between the first half of the burst and the second half of the burst. In one example, memory device 310 accesses 256 bits per read from the array and sends the 256 bits to host 320 as two portions. The first half of the burst transmits 128 bits fetched from BG[1], Bank[2] with fetch 330-1, as 8 data bits each from DQ[0:15], one bit from each DQ for each cycle of the transfer. Thus, for a 256-bit data transfer, memory device 310 can access 128 bits per fetch for 16 DQ bits by BL8, performed twice from the same bank.

In one example, memory device 310 is a DRAM (dynamic random access memory) device compatible with a double data rate version 5 (DDR5) standard from JEDEC (Joint Electron Device Engineering Council, now the JEDEC Solid State Technology Association). DDR5 DRAMs are produced in x4, x8, and x16 varieties, with 4, 8, and 16 data signals per device, respectively, between the DRAM device and the memory controller of host 320. Typically, x4 and x8 implementations are used in server computers, and client computers generally use x8 or x16 devices. System 302 can change the architecture of a DDR5 x16 DRAM device to provide higher performance at lower power. The application of system 302 is not limited to use with a DDR5 DRAM device. The application of system 302 is not limited to devices with 32 banks.

Figure 3B:
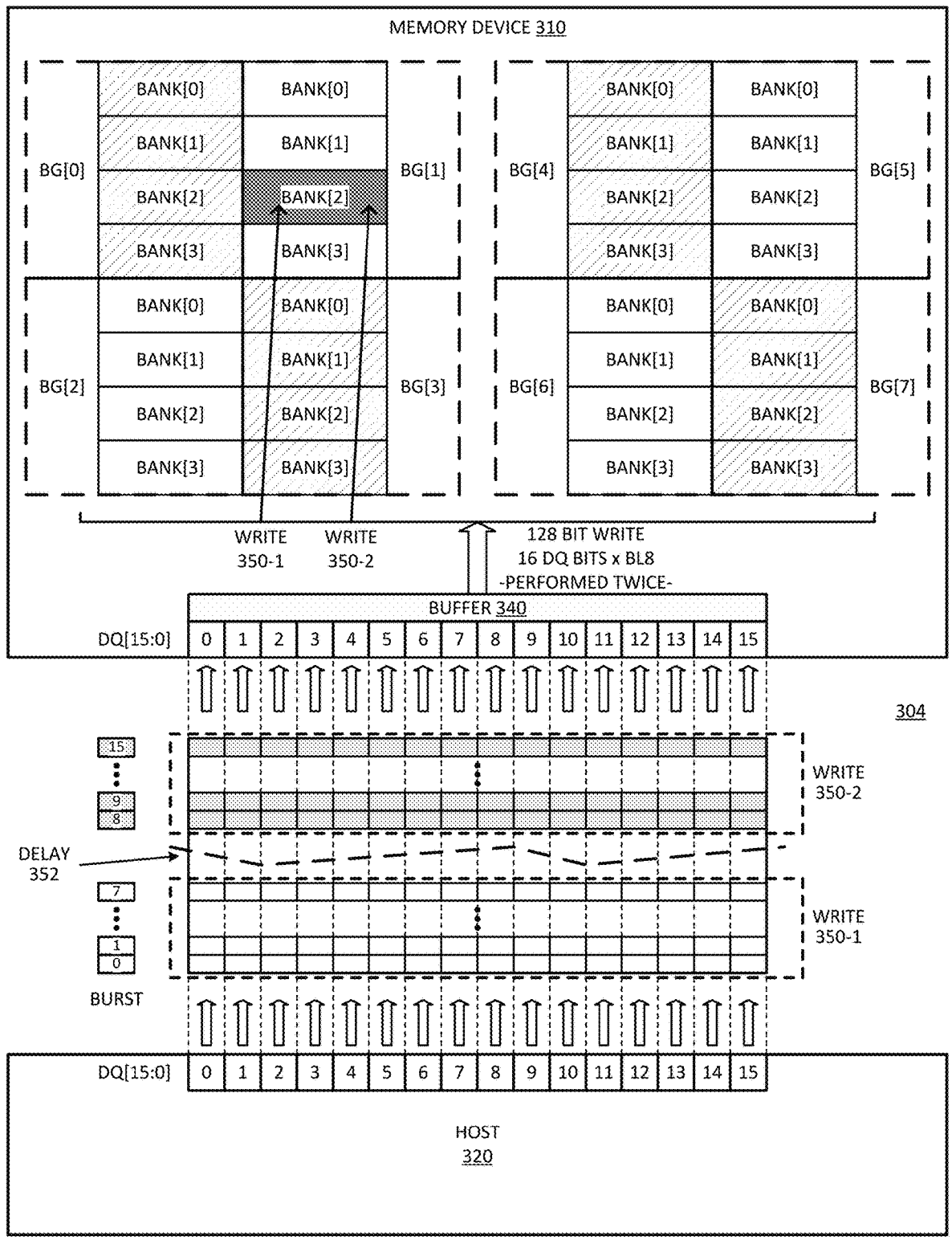
FIG. 3B is a block diagram of an example of a system that write data to a single bank with consecutive accesses for a write transaction.

FIG. 3B is a block diagram of an example of a system that write data to a single bank with consecutive accesses for a write transaction. System 304 illustrates a system in accordance with an example of system 200. System 304 illustrates an example of system 302 for a write transaction. System 304 includes memory device 310 connected to host 320. An example of memory device 310 includes 32 banks organized as 8 BG by 4 banks per BG.

Memory device 310 receives write data associated with a write command from host 320. Memory device 310 will write the data for the write to a single bank by accessing the bank twice in response to a single write command from host

320. As illustrated, if Bank[2] of BG[1] is selected, only that bank is accessed, by write 350-1 and 350-2. Thus, in system 304, the data from DQ[0:15] goes to BG[1] Bank[2], with the data bits for the first 8 cycles (BL [0:7], the first half of the burst) written with write 350-1 and the data bits for the second 8 cycles (BL [8:15], the second half of the burst) written with write 350-2.

System 300 illustrates a burst of BL16, with optional delay 352 between the first half of the burst and the second half of the burst. In one example, host 320 sends 256 bits per write, and memory device 310 writes the 256 bits to the array as two internal operations. The first half of the burst transmits 128 bits in accordance with standard timing of a write command. In one example, the second half of the burst transmits 128 bits immediately after the first half (i.e., there is no delay 352). In one example, the second half of the burst occurs after a non-zero delay 352, where host 320 can control the timing of the transfer of the second 128 bits.

In one example, memory device 310 includes buffer 340 to buffer the write data from host 320. In one example, memory device 310 buffers the write data to allow sufficient time between write 350-1 and write 350-2 to allow back-to-back writes to BG[1], Bank[2].

FIGS. 4A-4D are timing diagrams of examples of accessing data from a bank with multiple accesses and controls burst transfer timing. Diagram 402, diagram 404, diagram 406, and diagram 408 represent timing diagrams for different transfer options for a memory device. The timing diagrams can apply to an example of system 200 or an example of system 302. In accordance with the different examples, the system can control the timing of the data transfers to allow the sending of data from a single access to the same bank.

Referring to FIG. 4A, diagram 402 illustrates the first data transfer occurring as soon as the data is accessed and ready, and there is a delay between the first data transfer and the second data transfer. Clock 410 represents a clock signal, with data transfer occurring on the rising clock edge and on the falling clock edge. Command (CMD) bus 422 represents a command from the host to the memory device. Command bus 422 illustrates the read command (RD) from the host memory controller.

After some time, illustrated by the time break, the memory device generates an internal command as illustrated by command (CMD) 432. In one example, the memory device generates two different internal operations in response to the read command, as illustrated by RD1 and RD2. Delay 430 represents a delay between RD1 and RD2. Delay 430 is at least the minimum delay required between back-to-back accesses to the same bank.

In one example, the memory device controls the transmission of the read data by enabling a data transfer. Transfer 442 represents the enabling of transferring the data. In diagram 402, as soon as the first read data is accessed by RD1, transfer 442 is enabled, and the memory device sends the first portion of data on DQ (data) bus 452, as shown by the first transfer. In one example, the first transfer is BL8 of a total BL16. The same flow of operations can function with a different burst length.

Delay 430 illustrates the delay between RD1 and RD2. In one example, the memory device sends the data of the first transfer as soon as the data is ready from RD1. In one example, the memory device sends the data of the second transfer as soon as the data is ready from RD2. Delay 462 represents the delay between the first transfer and the second transfer.

As an example, diagram 402 illustrates the time in burst lengths below DQ bus 452. If the first transfer is considered to be sent in a time slot of BL8-0, in one example, the system can control delay 430 to generate RD2 to cause the data for the second transfer to be ready at BL8-4, with BL8-1, BL8-2, and BL8-3 between the first and second transfers. In one example, the timing of the read delay and the timing of the transfers allows the timing to work out as shown. In one example, the memory device internal control can control the timing of the second read operation to align the timing as illustrated.

As illustrated with transfer 442, in one example, the memory device enables transfer for the first transfer as soon as RD1 occurs and the data is ready, and enables transfer for the second transfer as soon as RD2 occurs and the data is ready.

It will be understood that the first half of the data comes with the best latency, but the timing of the second data can create complex timings if the delay between transfers is dependent on data rate. In one example, the internal controller would need to control the timing of the second internal read operation based on the data rate of the transfer.

Referring to FIG. 4B, diagram 404 illustrates holding the data for the first data transfer to align the first data transfer with the second data transfer. Clock 410 represents a clock signal, with data transfer occurring on the rising clock edge and on the falling clock edge. Command (CMD) bus 422 represents a command from the host to the memory device. Command bus 422 illustrates the read command (RD) from the host memory controller.

After some time, illustrated by the time break, the memory device generates an internal command as illustrated by command (CMD) 432. In one example, the memory device generates two different internal operations in response to the read command, as illustrated by RD1 and RD2. Delay 430 represents a delay between RD1 and RD2. Delay 430 is at least the minimum delay required between back-to-back accesses to the same bank.

In one example, the memory device controls the transmission of the read data by enabling a data transfer. Transfer 444 represents the enabling of transferring the data. In diagram 404, the data for the first transfer can be considered ready as soon as RD1 occurs, during the time slot BL8-0. Instead of sending the first transfer as soon as the first read data is accessed by RD1, transfer 444 is disabled, and the memory device holds the first portion of data for delay 464.

As illustrated in diagram 404, delay 464 holds the first data transfer during BL8-0, BL8-1, and BL8-2. The memory device can enable transfer at BL8-3, as shown by transfer 444, causing the memory device to send the first data transfer on DQ (data) bus 454 during BL8-3. In one example, the first transfer is BL8 of a total BL16. The same flow of operations can function with a different burst length.

Delay 430 illustrates the delay between RD1 and RD2. In one example, the memory device enables the transfer of data to trigger the sending of the first transfer to cause the first transfer to end just as RD2 causes the data of the second transfer to be ready to send. Transfer 444 can remain enabled, and as soon as the data of the second transfer is ready, the memory device sends the second transfer, as shown on DQ bus 454. Thus, the first transfer and the second transfer can be sent contiguously or consecutively without delay on the data bus.

It will be understood that holding the data of the first transfer to align the first transfer with the second transfer has the least complexity for the memory controller, seeing there will be a continuous BL16 burst. However, the reduced complexity comes at the cost of higher latency for the first transfer.

Referring to FIG. 4C, diagram 406 illustrates holding the data for the first data transfer to align the first data transfer and the second data transfer with a data interleaving pattern. Clock 410 represents a clock signal, with data transfer occurring on the rising clock edge and on the falling clock edge. Command (CMD) bus 422 represents a command from the host to the memory device. Command bus 422 illustrates the read command (RD) from the host memory controller.

After some time, illustrated by the time break, the memory device generates an internal command as illustrated by command (CMD) 432. In one example, the memory device generates two different internal operations in response to the read command, as illustrated by RD1 and RD2. Delay 430 represents a delay between RD1 and RD2. Delay 430 is at least the minimum delay required between back-to-back accesses to the same bank.

In one example, the memory device controls the transmission of the read data by enabling a data transfer. Transfer 444 represents the enabling of transferring the data. In diagram 406, the data for the first transfer can be considered ready as soon as RD1 occurs, during the time slot BL8-0. Instead of sending the first transfer as soon as the first read data is accessed by RD1, transfer 446 is disabled, and the memory device holds the first portion of data for delay 466.

As illustrated in diagram 406, delay 466 holds the first data transfer during BL8-0 and BL8-1. The memory device can enable transfer at BL8-2, as shown by transfer 446, causing the memory device to send the first data transfer on DQ (data) bus 456 during BL8-2. In one example, the first transfer is BL8 of a total BL16. The same flow of operations can function with a different burst length.

Delay 430 illustrates the delay between RD1 and RD2. In one example, the memory device enables the transfer of data to trigger the sending of the first transfer to cause the first transfer to end at BL8-3, to have a timing delay or gap of BL8 between the first transfer and the second transfer. The BL8 gap can enable the memory controller to schedule different data accesses with BL8 slots, interleaving data for the transfers. As RD2 causes the data of the second transfer to be ready to send, the memory device can send the data of the second transfer as soon as it is ready, during BL8-4. Transfer 446 illustrates the enabling of sending the first transfer during BL8-2, holding the data for delay 466 before sending, and enabling the second transfer at BL8-4 as soon the second data is ready. Delay 468 can be a BL8 transfer period, as illustrated in diagram 406, or can be some other window of time.

Referring to FIG. 4D, diagram 408 illustrates the host sending a second read command to cause the second transfer to occur. Clock 410 represents a clock signal, with data transfer occurring on the rising clock edge and on the falling clock edge. Command (CMD) bus 424 represents a command from the host to the memory device. Command bus 424 illustrates the read command (READ1) from the host memory controller.

After some time, illustrated by the time break, the memory device generates an internal command as illustrated by command (CMD) 432. In one example, the memory device generates only one internal operation in response to the read command, as illustrated by RD1. Thus, to cause the memory device to perform the second read or fetch operation illustrated by RD2, the memory controller of the host sends a second read command on command bus 424, as illustrated by READ2. Delay 430 represents a delay between RD1 and RD2. Delay 430 is at least the minimum delay required between back-to-back accesses to the same bank.

Transfer 448 represents the enabling of the transfer of the first data and the second data. In one example, the transfer of the first data can be in accordance with any example of diagram 402, diagram 404, or diagram 406. Diagram 408 simply illustrates that a second read command from the host may be utilized to trigger the internal operation RD2, which then causes the data of the second transfer to be ready for transfer at BL8-4.

For diagram 402, diagram 404, diagram 406, and diagram 408, consider examples for DDR5 devices. A DDR5 device has a specified delay for back to back access from the same bank. The delay must be at least tCCD_L, which is approximately 5 ns (nanoseconds) for DDR5 devices. At the higher speeds of the DDR5 device, the 5 ns delay is much longer than the time it takes to transfer the data on the 16 bits of the data bus. A BL8 time period on the data bus takes only 1.66 ns at a 4800 data rate, or 1.25 ns at a 6400 data rate. The tCCD_L time for DDR5 is 3 and 4 times the BL8 transfer period, respectively, which would result in a large gap in the first and second halves of the transfers. In one example, the system can extend delay 430 to cause the delay to be greater than tCCD_L.

The different examples of diagram 402, diagram 404, diagram 406, and diagram 408 allow the delay of the first data transfer, delay of the second data transfer, or delay of both the first data transfer and the second data transfer to align the data for higher bus utilization. Leaving an interleaving gap enables the memory controller to have a transfer window between the first transfer and the second transfer to interleave a BL8 or M/2 burst of data from another bank between the first transfer and the second transfer.

The operation of diagram 406 provides a compromise between complexity and latency. The ability to time the data transfers to provide a gap that is the right size to interleave data from another access operation reduces the initial transfer delay, and allows good data bus utilization. Such an approach has been used when a memory device has a native delay that allows for such a timing gap. In diagram 406, the system introduces a delay to provide the interleave gap, because the native delay of the data access and data transfer would not provide the interleaving gap.

In one example, the timing of delay 430 can be set by configuration, such as being programmable by mode register setting. In one example, delay 430 can be programmable based on data rate. In one example, delay 466 can be set by configuration, such as programmable by mode register setting. In one example, delay 466 can be programmable based on data rate. Thus, selection of a data rate can be accompanied by setting a delay timing to control delay 430 or delay 466, or both delay 430 and delay 466 to time the first and second data transfers.

Figure 5:
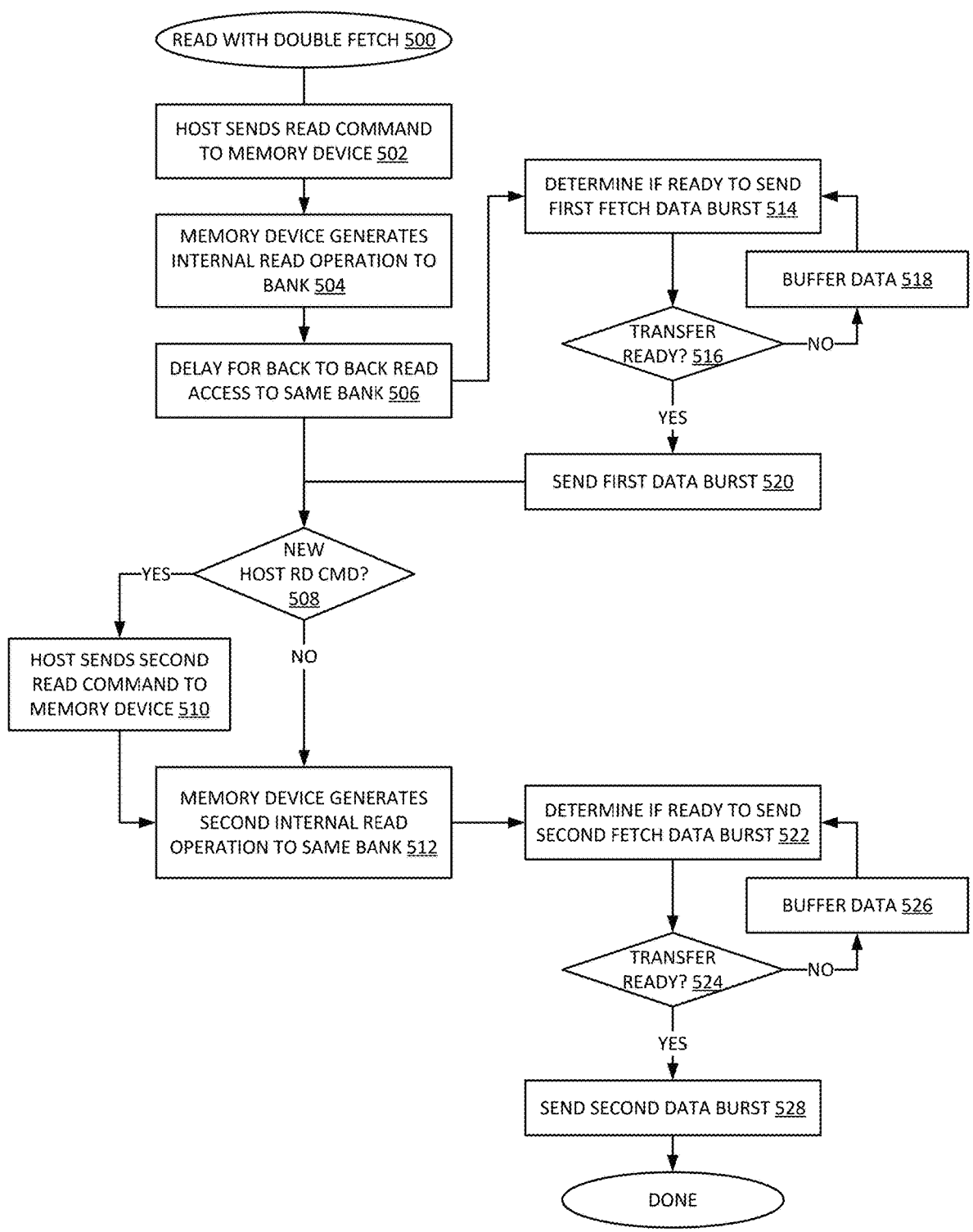
FIG. 5 is a flow diagram of an example of a process for accessing data from a bank with consecutive accesses.

FIG. 5 is a flow diagram of an example of a process for accessing data from a bank with consecutive accesses. Process 500 represents an example of a process to access data and transfer data based on consecutive accesses to a bank when a single access does not generate enough data for a data transfer. Process 500 represents an example of a process that can be executed by a system in accordance with system 200 or system 302.

In one example, the host sends a read command to the memory device, at 502. The memory device generates an internal read operation to a selected bank of the memory device, at 504. The memory device can provide a delay between internal operations for back to back reads access to the same bank, at 506.

In one example, if the host is to cause a delay between internal read operations based on separate host read commands, the host will send two commands to cause the two internal operations. If there is a new host read command, at 508 YES branch, in one example, the host sends the second read command to the memory device, at 510. If there is not a new host read command, at 508 NO branch, or in response to a second host read if there is a new host read command, the memory device generates a second internal read operation to the same bank, at 512.

In one example, after accessing the first bank and entering the delay for back to back access, at 506, the memory device can determine if it is ready to send the first fetch data burst, at 514. The determination can be in accordance with a configuration (such as mode register settings) or programming to determine when to send the first data burst for the desired data transfer. If the data is ready and the memory device determines the transfer is ready, at 516 YES branch, the memory device can send the first data burst, at 520. The memory device then waits for the second internal operation. If the data is ready and the memory device determines the first transfer is not ready, at 516 NO branch, in one example, the memory device buffers the data, at 518, and awaits the transfer, continuing to determine if the first data burst should be sent, at 514.

In one example, in response to the memory device generating the second internal read operation, at 512, the memory device can determine if the memory device can determine if it is ready to send the second fetch data burst, at 522. The determination can be in accordance with a configuration (such as mode register settings) or programming to determine when to send the first data burst for the desired data transfer. If the data is ready and the memory device determines the transfer is ready, at 524 YES branch, the memory device can send the second data burst, at 528. The read operation is then completed and process 500 is done. If the data is ready and the memory device determines the second transfer is not ready, at 524 NO branch, in one example, the memory device buffers the data, at 526, and awaits the transfer, continuing to determine if the first data burst should be sent, at 522.

Figure 6:
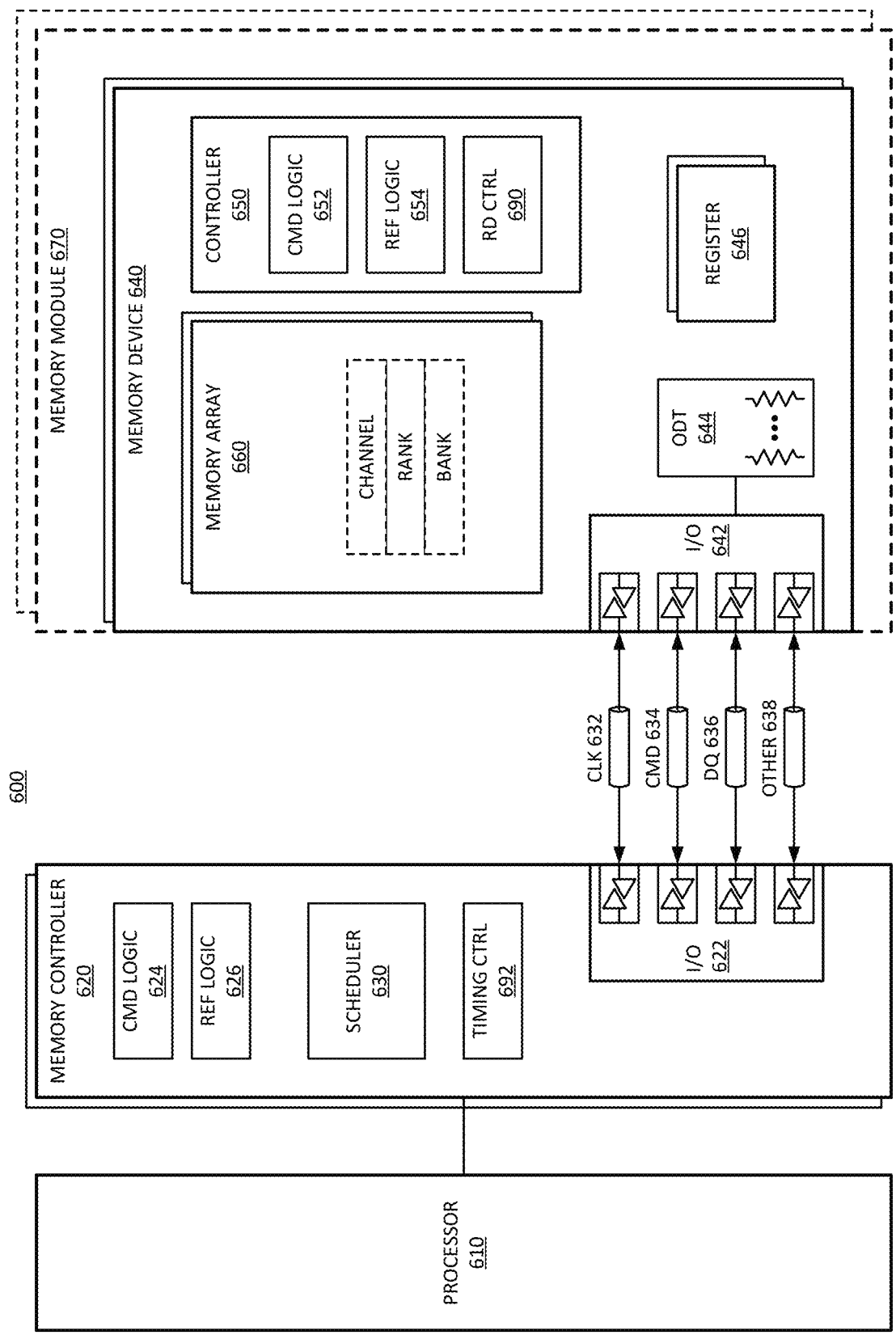
FIG. 6 is a block diagram of an example of a memory subsystem in which single bank access with burst timing control can be implemented.

FIG. 6 is a block diagram of an example of a memory subsystem in which single bank access with burst timing control can be implemented. System 600 includes a processor and elements of a memory subsystem in a computing device. System 600 is an example of a system in accordance with an example of system 200 or system 302.

In one example, an access of memory array 660 of memory device 640 accesses only half of the data needed for a full data transfer between memory 640 and memory controller 620. Controller 650 of memory device 640 can include read control (CTRL) 690 to manage the timing of sending data transfers for read. Controller 650 will access the same bank of memory array 660 twice to access the full amount of data needed for the access transaction. Read control 690 can manage the timing of internal operations to align and transfer the data from the two internal accesses as two portions of a full data burst in accordance with any example herein. While a write control is not specifically shown, write control would complement the read control to manage the timing for write operations. In one example, memory controller 620 includes timing control (CTRL) 692 to enable scheduler 630 to schedule commands based on timing of data transfers.

Processor 610 represents a processing unit of a computing platform that may execute an operating system (OS) and applications, which can collectively be referred to as the host or the user of the memory. The OS and applications execute operations that result in memory accesses. Processor 610 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 600 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random-access memory), or some variant such as synchronous DRAM (SDRAM). A memory subsystem as described herein may be compatible with a number of memory technologies, such as DDR4 (double data rate version 4, JESD79-4, originally published in September 2012 by JEDEC (Joint Electron Device Engineering Council, now the JEDEC Solid State Technology Association), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, originally published by JEDEC in July 2020), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

Memory controller 620 represents one or more memory controller circuits or devices for system 600. Memory controller 620 represents control logic that generates memory access commands in response to the execution of operations by processor 610. Memory controller 620 accesses one or more memory devices 640. Memory devices 640 can be DRAM devices in accordance with any referred to above. In one example, memory devices 640 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 620 manages a separate memory channel, although system 600 can be configured to have multiple channels managed by a single controller, or to have multiple controllers on a single channel. In one example, memory controller 620 is part of host processor 610, such as logic implemented on the same die or implemented in the same package space as the processor.

Memory controller 620 includes I/O interface logic 622 to couple to a memory bus, such as a memory channel as referred to above. I/O interface logic 622 (as well as I/O interface logic 642 of memory device 640) can include pins, pads, connectors, signal lines, traces, or wires, or other hardware to connect the devices, or a combination of these. I/O interface logic 622 can include a hardware interface. As illustrated, I/O interface logic 622 includes at least drivers/transceivers for signal lines. Commonly, wires within an integrated circuit interface couple with a pad, pin, or connector to interface signal lines or traces or other wires between devices. I/O interface logic 622 can include drivers, receivers, transceivers, or termination, or other circuitry or combinations of circuitry to exchange signals on the signal lines between the devices. The exchange of signals includes at least one of transmit or receive. While shown as coupling I/O 622 from memory controller 620 to I/O 642 of memory device 640, it will be understood that in an implementation of system 600 where groups of memory devices 640 are accessed in parallel, multiple memory devices can include I/O interfaces to the same interface of memory controller 620. In an implementation of system 600 including one or more memory modules 670, I/O 642 can include interface hardware of the memory module in addition to interface hardware on the memory device itself. Other memory controllers 620 will include separate interfaces to other memory devices 640.

The bus between memory controller 620 and memory devices 640 can be implemented as multiple signal lines coupling memory controller 620 to memory devices 640. The bus may typically include at least clock (CLK) 632, command/address (CMD) 634, and write data (DQ) and read data (DQ) 636, and zero or more other signal lines 638. In one example, a bus or connection between memory controller 620 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 600 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 620 and memory devices 640. An example of a serial bus technology is 8B10B encoding and transmission of high-speed data with embedded clock over a single differential pair of signals in each direction. In one example, CMD 634 represents signal lines shared in parallel with multiple memory devices. In one example, multiple memory devices share encoding command signal lines of CMD 634, and each has a separate chip select (CS_n) signal line to select individual memory devices.

It will be understood that in the example of system 600, the bus between memory controller 620 and memory devices 640 includes a subsidiary command bus CMD 634 and a subsidiary bus to carry the write and read data, DQ 636. In one example, the data bus can include bidirectional lines for read data and for write/command data. In another example, the subsidiary bus DQ 636 can include unidirectional write signal lines for write and data from the host to memory, and can include unidirectional lines for read data from the memory to the host. In accordance with the chosen memory technology and system design, other signals 638 may accompany a bus or sub bus, such as strobe lines DQS. Based on design of system 600, or implementation if a design supports multiple implementations, the data bus can have more or less bandwidth per memory device 640. For example, the data bus can support memory devices that have either a x4 interface, a x8 interface, a x16 interface, or other interface. The convention "xW," where W is an integer that refers to an interface size or width of the interface of memory device 640, which represents a number of signal lines to exchange data with memory controller 620. The interface size of the memory devices is a controlling factor on how many memory devices can be used concurrently per channel in system 600 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 640 and memory controller 620 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 640 can transfer data on each UI. Thus, a x8 memory device operating on BL8 can transfer 64 bits of data (8 data signal lines times 6 data bits transferred per line over the burst). It will be understood that this simple example is merely an illustration and is not limiting.

Memory devices 640 represent memory resources for system 600. In one example, each memory device 640 is a separate memory die. In one example, each memory device 640 can interface with multiple (e.g., 2) channels per device or die. Each memory device 640 includes I/O interface logic 642, which has a bandwidth determined by the implementation of the device (e.g., x16 or x8 or some other interface bandwidth). I/O interface logic 642 enables the memory devices to interface with memory controller 620. I/O interface logic 642 can include a hardware interface, and can be in accordance with I/O 622 of memory controller, but at the memory device end. In one example, multiple memory devices 640 are connected in parallel to the same command and data buses. In another example, multiple memory devices 640 are connected in parallel to the same command bus, and are connected to different data buses. For example, system 600 can be configured with multiple memory devices 640 coupled in parallel, with each memory device responding to a command, and accessing memory resources 660 internal to each. For a Write operation, an individual memory device 640 can write a portion of the overall data word, and for a Read operation, an individual memory device 640 can fetch a portion of the overall data word. The remaining bits of the word will be provided or received by other memory devices in parallel.

In one example, memory devices 640 are disposed directly on a motherboard or host system platform (e.g., a PCB (printed circuit board) on which processor 610 is disposed) of a computing device. In one example, memory devices 640 can be organized into memory modules 670. In one example, memory modules 670 represent dual inline memory modules (DIMMs). In one example, memory modules 670 represent other organization of multiple memory devices to share at least a portion of access or control circuitry, which can be a separate circuit, a separate device, or a separate board from the host system platform. Memory modules 670 can include multiple memory devices 640, and the memory modules can include support for multiple separate channels to the included memory devices disposed on them. In another example, memory devices 640 may be incorporated into the same package as memory controller 620, such as by techniques such as multi-chip-module (MCM), package-on-package, through-silicon via (TSV), or other techniques or combinations. Similarly, in one example, multiple memory devices 640 may be incorporated into memory modules 670, which themselves may be incorporated into the same package as memory controller 620. It will be appreciated that for these and other implementations, memory controller 620 may be part of host processor 610.

Memory devices 640 each include one or more memory arrays 660. Memory array 660 represents addressable memory locations or storage locations for data. Typically, memory array 660 is managed as rows of data, accessed via wordline (rows) and bitline (individual bits within a row) control. Memory array 660 can be organized as separate channels, ranks, and banks of memory. Channels may refer to independent control paths to storage locations within memory devices 640. Ranks may refer to common locations across multiple memory devices (e.g., same row addresses within different devices) in parallel. Banks may refer to sub-arrays of memory locations within a memory device 640. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 640 include one or more registers 644. Register 644 represents one or more storage devices or storage locations that provide configuration or settings for the operation of the memory device. In one example, register 644 can provide a storage location for memory device 640 to store data for access by memory controller 620 as part of a control or management operation. In one example, register 644 includes one or more Mode Registers. In one example, register 644 includes one or more multipurpose registers. The configuration of locations within register 644 can configure memory device 640 to operate in different "modes," where command information can trigger different operations within memory device 640 based on the mode. Additionally or in the alternative, different modes can also trigger different operation from address information or other signal lines depending on the mode. Settings of register 644 can indicate configuration for I/O settings (e.g., timing, termination or ODT (on-die termination) 646, driver configuration, or other I/O settings).

In one example, memory device 640 includes ODT 646 as part of the interface hardware associated with I/O 642. ODT 646 can be configured as mentioned above, and provide settings for impedance to be applied to the interface to specified signal lines. In one example, ODT 646 is applied to DQ signal lines. In one example, ODT 646 is applied to command signal lines. In one example, ODT 646 is applied to address signal lines. In one example, ODT 646 can be applied to any combination of the preceding. The ODT settings can be changed based on whether a memory device is a selected target of an access operation or a non-target device. ODT 646 settings can affect the timing and reflections of signaling on the terminated lines. Careful control over ODT 646 can enable higher-speed operation with improved matching of applied impedance and loading. ODT 646 can be applied to specific signal lines of I/O interface 642, 622 (for example, ODT for DQ lines or ODT for C/A lines), and is not necessarily applied to all signal lines.

Memory device 640 includes controller 650, which represents control logic within the memory device to control internal operations within the memory device. For example, controller 650 decodes commands sent by memory controller 620 and generates internal operations to execute or satisfy the commands. Controller 650 can be referred to as an internal controller, and is separate from memory controller 620 of the host. Controller 650 can determine what mode is selected based on register 644, and configure the internal execution of operations for access to memory resources 660 or other operations based on the selected mode. Controller 650 generates control signals to control the routing of bits within memory device 640 to provide a proper interface for the selected mode and direct a command to the proper memory locations or addresses. Controller 650 includes command logic 652, which can decode command encoding received on command and address signal lines. Thus, command logic 652 can be or include a command decoder. With command logic 652, memory device can identify commands and generate internal operations to execute requested commands.

Referring again to memory controller 620, memory controller 620 includes command (CMD) logic 624, which represents logic or circuitry to generate commands to send to memory devices 640. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 640, memory controller 620 can issue commands via I/O 622 to cause memory device 640 to execute the commands. In one example, controller 650 of memory device 640 receives and decodes command and address information received via I/O 642 from memory controller 620. Based on the received command and address information, controller 650 can control the timing of operations of the logic and circuitry within memory device 640 to execute the commands. Controller 650 is responsible for compliance with standards or specifications within memory device 640, such as timing and signaling requirements. Memory controller 620 can implement compliance with standards or specifications by access scheduling and control.

Memory controller 620 includes scheduler 630, which represents logic or circuitry to generate and order transactions to send to memory device 640. From one perspective, the primary function of memory controller 620 could be said to schedule memory access and other transactions to memory device 640. Such scheduling can include generating the transactions themselves to implement the requests for data by processor 610 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 620 typically includes logic such as scheduler 630 to allow selection and ordering of transactions to improve performance of system 600. Thus, memory controller 620 can select which of the outstanding transactions should be sent to memory device 640 in which order, which is typically achieved with logic much more complex that a simple first-in first-out algorithm. Memory controller 620 manages the transmission of the transactions to memory device 640, and manages the timing associated with the transaction. In one example, transactions have deterministic timing, which can be managed by memory controller 620 and used in determining how to schedule the transactions with scheduler 630.

In one example, memory controller 620 includes refresh (REF) logic 626. Refresh logic 626 can be used for memory resources that are volatile and need to be refreshed to retain a deterministic state. In one example, refresh logic 626 indicates a location for refresh, and a type of refresh to perform. Refresh logic 626 can trigger self-refresh within memory device 640, or execute external refreshes which can be referred to as auto refresh commands) by sending refresh commands, or a combination. In one example, controller 650 within memory device 640 includes refresh logic 654 to apply refresh within memory device 640. In one example, refresh logic 654 generates internal operations to perform refresh in accordance with an external refresh received from memory controller 620. Refresh logic 654 can determine if a refresh is directed to memory device 640, and what memory resources 660 to refresh in response to the command.

Figure 7:
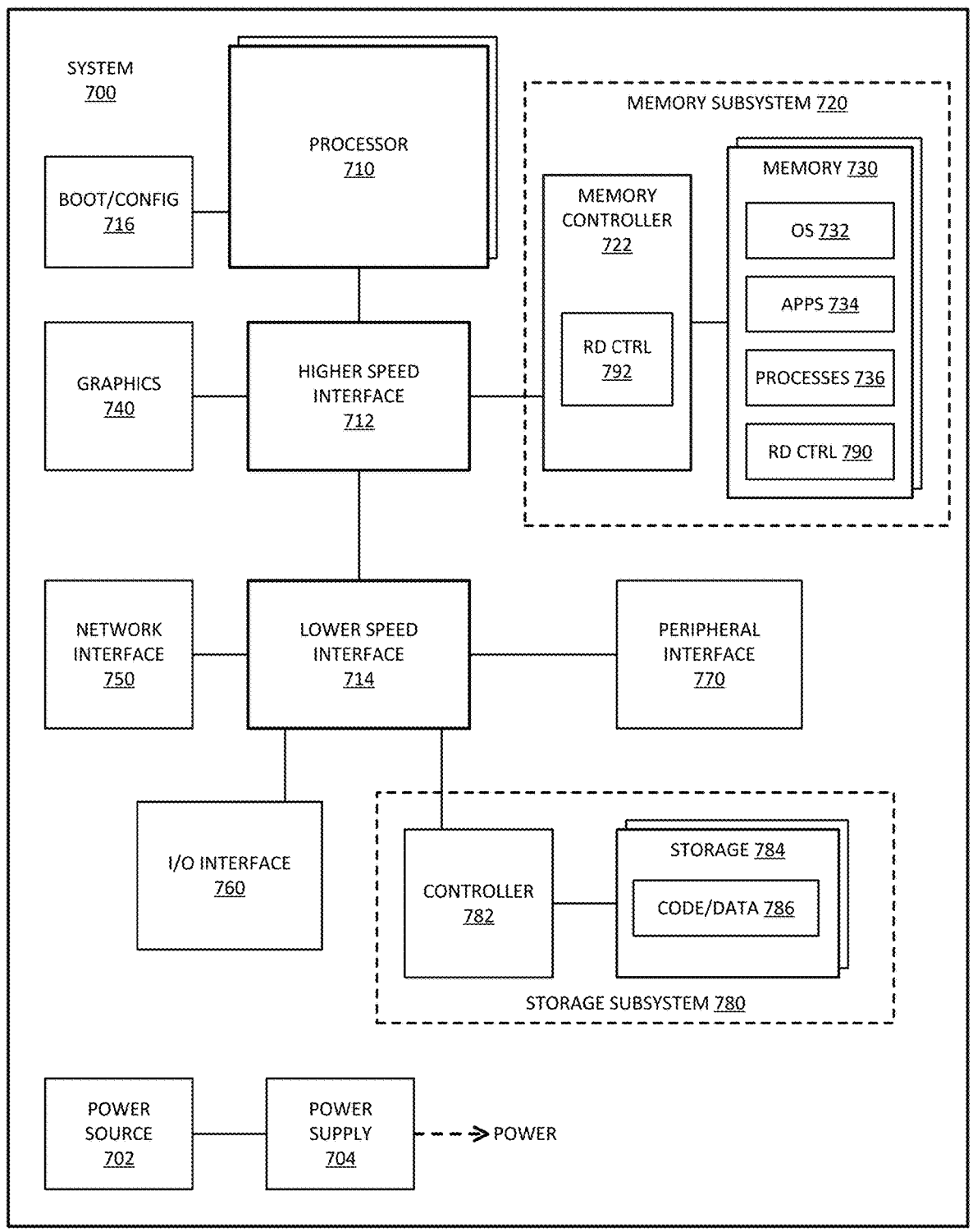
FIG. 7 is a block diagram of an example of a computing system in which single bank access with burst timing control can be implemented.

FIG. 7 is a block diagram of an example of a computing system in which single bank access with burst timing control can be implemented. System 700 represents a computing device in accordance with any example herein, and can be a laptop computer, a desktop computer, a tablet computer, a server, a gaming or entertainment control system, embedded computing device, or other electronic device. System 700 is an example of a system in accordance with an example of system 200 or system 302.

In one example, an access of memory 730 accesses only half of the data needed for a full data transfer between memory 730 and memory controller 722. Memory 730 can include read (RD) control (CTRL) 790 to manage the timing of sending data transfers for read. Memory 730 will access the same bank of its memory array twice to access the full amount of data needed for the access transaction. Read control 790 can manage the timing of internal operations to align and transfer the data from the two internal accesses as two portions of a full data burst in accordance with any example herein. While a write control is not specifically shown, write control would complement the read control to manage the timing for write operations. In one example, memory controller 722 includes read (RD) control (CTRL) 792 to enable the scheduling of commands based on timing of data transfers.

System 700 includes processor 710 can include any type of microprocessor, central processing unit (CPU), graphics processing unit (GPU), processing core, or other processing hardware, or a combination, to provide processing or execution of instructions for system 700. Processor 710 can be a host processor device. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or a combination of such devices.

System 700 includes boot/config 716, which represents storage to store boot code (e.g., basic input/output system (BIOS)), configuration settings, security hardware (e.g., trusted platform module (TPM)), or other system level hardware that operates outside of a host OS. Boot/config 716 can include a nonvolatile storage device, such as read-only memory (ROM), flash memory, or other memory devices.

In one example, system 700 includes interface 712 coupled to processor 710, which can represent a higher speed interface or a high throughput interface for system components that need higher bandwidth connections, such as memory subsystem 720 or graphics interface components 740. Interface 712 represents an interface circuit, which can be a standalone component or integrated onto a processor die. Interface 712 can be integrated as a circuit onto the processor die or integrated as a component on a system on a chip. Where present, graphics interface 740 interfaces to graphics components for providing a visual display to a user of system 700. Graphics interface 740 can be a standalone component or integrated onto the processor die or system on a chip. In one example, graphics interface 740 can drive a high definition (HD) display or ultra high definition (UHD) display that provides an output to a user. In one example, the display can include a touchscreen display. In one example, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more varieties of random-access memory (RAM) such as DRAM, 3DXP (three-dimensional crosspoint), or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710, such as integrated onto the processor die or a system on a chip.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 700 includes interface 714, which can be coupled to interface 712. Interface 714 can be a lower speed interface than interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, NAND, 3DXP, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one example, storage subsystem 780 includes controller 782 to interface with storage 784. In one example controller 782 is a physical part of interface 714 or processor 710, or can include circuits or logic in both processor 710 and interface 714.

Power source 702 provides power to the components of system 700. More specifically, power source 702 typically interfaces to one or multiple power supplies 704 in system 700 to provide power to the components of system 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 or power supply 704 includes wireless charging hardware to charge via proximity to a charging field. In one example, power source 702 can include an internal battery or fuel cell source.

Figure 8:
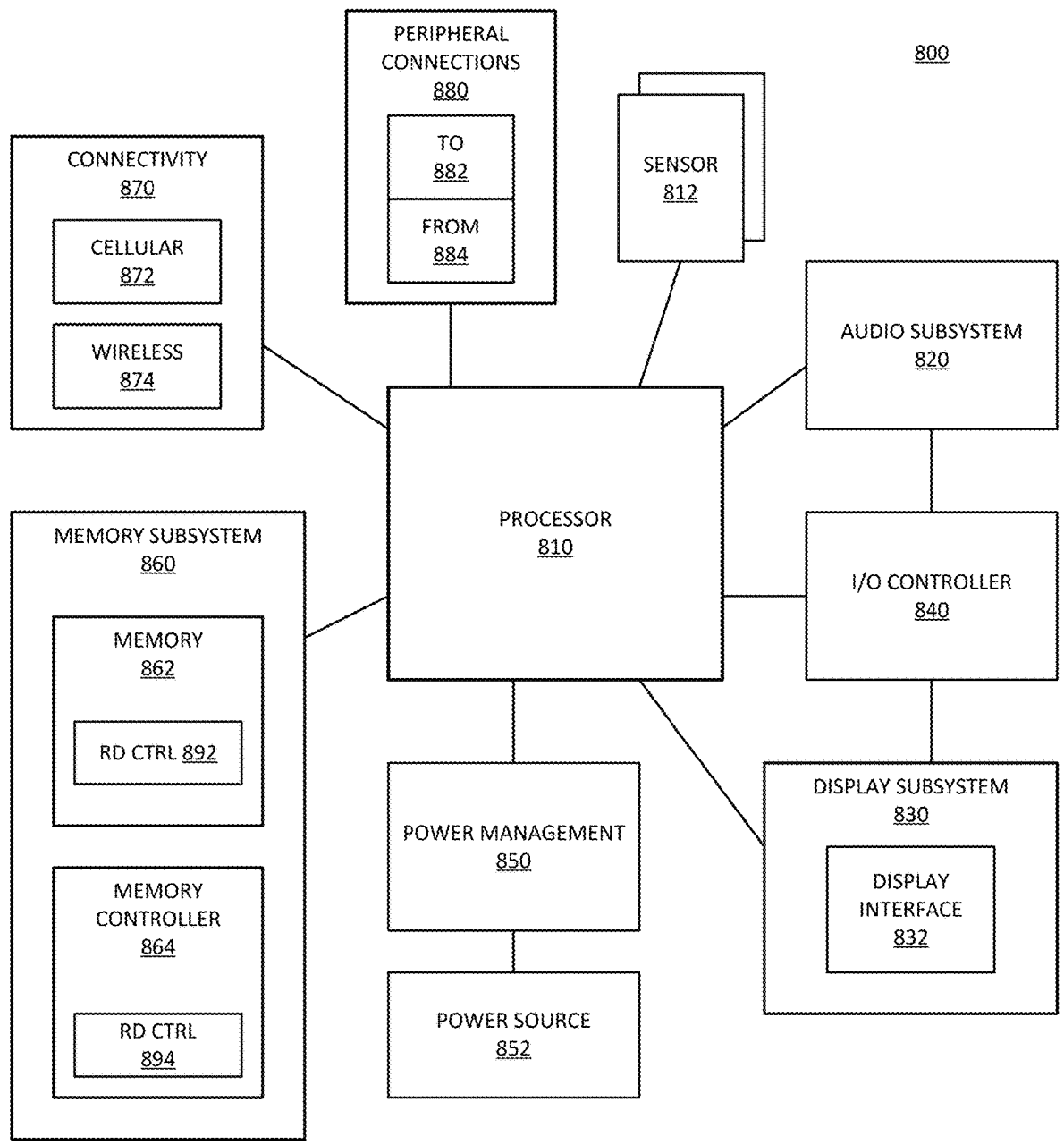
FIG. 8 is a block diagram of an example of a mobile device in which single bank access with burst timing control can be implemented.

FIG. 8 is a block diagram of an example of a mobile device in which single bank access with burst timing control can be implemented. System 800 represents a mobile computing device, such as a computing tablet, a mobile phone or smartphone, wearable computing device, or other mobile device, or an embedded computing device. It will be understood that certain of the components are shown generally, and not all components of such a device are shown in system 800.

System 800 is an example of a system in accordance with an example of system 200 or system 302. In one example, an access of memory 862 accesses only half of the data needed for a full data transfer between memory 862 and memory controller 864. Memory 862 can include read (RD) control (CTRL) 892 to manage the timing of sending data transfers for read. Memory 862 will access the same bank of its memory array twice to access the full amount of data needed for the access transaction. Read control 892 can manage the timing of internal operations to align and transfer the data from the two internal accesses as two portions of a full data burst in accordance with any example herein. While a write control is not specifically shown, write control would complement the read control to manage the timing for write operations. In one example, memory controller 864 includes read (RD) control (CTRL) 894 to enable the scheduling of commands based on timing of data transfers.

System 800 includes processor 810, which performs the primary processing operations of system 800. Processor 810 can be a host processor device. Processor 810 can include one or more physical devices, such as microprocessors, application processors, microcontrollers, programmable logic devices, or other processing means. The processing operations performed by processor 810 include the execution of an operating platform or operating system on which applications and device functions are executed. The processing operations include operations related to I/O (input/output) with a human user or with other devices, operations related to power management, operations related to connecting system 800 to another device, or a combination. The processing operations can also include operations related to audio I/O, display I/O, or other interfacing, or a combination. Processor 810 can execute data stored in memory. Processor 810 can write or edit data stored in memory.

In one example, system 800 includes one or more sensors 812. Sensors 812 represent embedded sensors or interfaces to external sensors, or a combination. Sensors 812 enable system 800 to monitor or detect one or more conditions of an environment or a device in which system 800 is implemented. Sensors 812 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 812 can also include sensors for biometric systems such as fingerprint recognition systems, face detection or recognition systems, or other systems that detect or recognize user features. Sensors 812 should be understood broadly, and not limiting on the many different types of sensors that could be implemented with system 800. In one example, one or more sensors 812 couples to processor 810 via a frontend circuit integrated with processor 810. In one example, one or more sensors 812 couples to processor 810 via another component of system 800.

In one example, system 800 includes audio subsystem 820, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 800, or connected to system 800. In one example, a user interacts with system 800 by providing audio commands that are received and processed by processor 810.

Display subsystem 830 represents hardware (e.g., display devices) and software components (e.g., drivers) that provide a visual display for presentation to a user. In one example, the display includes tactile components or touchscreen elements for a user to interact with the computing device. Display subsystem 830 includes display interface 832, which includes the particular screen or hardware device used to provide a display to a user. In one example, display interface 832 includes logic separate from processor 810 (such as a graphics processor) to perform at least some processing related to the display. In one example, display subsystem 830 includes a touchscreen device that provides both output and input to a user. In one example, display subsystem 830 includes a high definition (HD) or ultra-high definition (UHD) display that provides an output to a user. In one example, display subsystem includes or drives a touchscreen display. In one example, display subsystem 830 generates display information based on data stored in memory or based on operations executed by processor 810 or both.

I/O controller 840 represents hardware devices and software components related to interaction with a user. I/O controller 840 can operate to manage hardware that is part of audio subsystem 820, or display subsystem 830, or both. Additionally, I/O controller 840 illustrates a connection point for additional devices that connect to system 800 through which a user might interact with the system. For example, devices that can be attached to system 800 might include microphone devices, speaker or stereo systems, video systems or other display device, keyboard or keypad devices, buttons/switches, or other I/O devices for use with specific applications such as card readers or other devices.

As mentioned above, I/O controller 840 can interact with audio subsystem 820 or display subsystem 830 or both. For example, input through a microphone or other audio device can provide input or commands for one or more applications or functions of system 800. Additionally, audio output can be provided instead of or in addition to display output. In another example, if display subsystem includes a touchscreen, the display device also acts as an input device, which can be at least partially managed by I/O controller 840. There can also be additional buttons or switches on system 800 to provide I/O functions managed by I/O controller 840.

In one example, I/O controller 840 manages devices such as accelerometers, cameras, light sensors or other environmental sensors, gyroscopes, global positioning system (GPS), or other hardware that can be included in system 800, or sensors 812. The input can be part of direct user interaction, as well as providing environmental input to the system to influence its operations (such as filtering for noise, adjusting displays for brightness detection, applying a flash for a camera, or other features).

In one example, system 800 includes power management 850 that manages battery power usage, charging of the battery, and features related to power saving operation. Power management 850 manages power from power source 852, which provides power to the components of system 800. In one example, power source 852 includes an AC to DC (alternating current to direct current) adapter to plug into a wall outlet. Such AC power can be renewable energy (e.g., solar power, motion based power). In one example, power source 852 includes only DC power, which can be provided by a DC power source, such as an external AC to DC converter. In one example, power source 852 includes wireless charging hardware to charge via proximity to a charging field. In one example, power source 852 can include an internal battery or fuel cell source.

Memory subsystem 860 includes memory device(s) 862 for storing information in system 800. Memory subsystem 860 can include nonvolatile (state does not change if power to the memory device is interrupted) or volatile (state is indeterminate if power to the memory device is interrupted) memory devices, or a combination. Memory 862 can store application data, user data, music, photos, documents, or other data, as well as system data (whether long-term or temporary) related to the execution of the applications and functions of system 800. In one example, memory subsystem 860 includes memory controller 864 (which could also be considered part of the control of system 800, and could potentially be considered part of processor 810). Memory controller 864 includes a scheduler to generate and issue commands to control access to memory device 862.

Connectivity 870 includes hardware devices (e.g., wireless or wired connectors and communication hardware, or a combination of wired and wireless hardware) and software components (e.g., drivers, protocol stacks) to enable system 800 to communicate with external devices. The external device could be separate devices, such as other computing devices, wireless access points or base stations, as well as peripherals such as headsets, printers, or other devices. In one example, system 800 exchanges data with an external device for storage in memory or for display on a display device. The exchanged data can include data to be stored in memory, or data already stored in memory, to read, write, or edit data.

Connectivity 870 can include multiple different types of connectivity. To generalize, system 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 874 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that system 800 could both be a peripheral device ("to" 882) to other computing devices, as well as have peripheral devices ("from" 884) connected to it. System 800 commonly has a "docking" connector to connect to other computing devices for purposes such as managing (e.g., downloading, uploading, changing, synchronizing) content on system 800. Additionally, a docking connector can allow system 800 to connect to certain peripherals that allow system 800 to control content output, for example, to audiovisual or other systems.

In addition to a proprietary docking connector or other proprietary connection hardware, system 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a memory device includes: a hardware interface to couple to a memory controller, wherein in response to a read command from the memory controller, the hardware interface is to transfer N data bits over a burst length M; a memory array having multiple banks, including a selected bank selected for read access for the read command, wherein the read access to the selected bank is to access N/2 data bits from the selected bank; and control hardware, wherein in response to the read command, the control hardware is to trigger two read accesses to the selected bank to access N data bits from the selected bank, and cause the hardware interface to send data as a first transfer of burst length M/2 of a first N/2 data bit portion and a second transfer of burst length M/2 of a second N/2 data bit portion.

In one example of the memory device, the control hardware is to cause the hardware interface to send the first transfer as soon as the first N/2 data bit portion is accessed from the selected bank, and to send the second transfer after a delay, as soon as the second N/2 data bit portion is accessed from the selected bank. In accordance with any preceding example of the memory device, in one example, the control hardware is to delay the transfer prior to sending the second transfer, to extend a delay between the first transfer and the second transfer to a period greater than a tCCD_L delay. In accordance with any preceding example of the memory device, in one example, the control hardware is to delay the first transfer prior to sending the first transfer. In accordance with any preceding example of the memory device, in one example, the delay comprises a delay of the first transfer to send the first transfer and the second transfer consecutively without delay between the first transfer and the second transfer. In accordance with any preceding example of the memory device, in one example, the delay comprises a delay of the first transfer to leave a transfer window between the first transfer and the second transfer, to interleave a third N/2 data bit portion from another of the multiple banks between the first transfer and the second transfer. In accordance with any preceding example of the memory device, in one example, the memory device further includes: a buffer to hold the first N/2 data bit portion for the delay. In accordance with any preceding example of the memory device, in one example, the control hardware is to generate two internal read access operations for the selected bank in response to the read command from the memory controller. In accordance with any preceding example of the memory device, in one example, the memory device comprises a dynamic random access memory (DRAM) device compatible with a low power double data rate (LPDDR) standard. In accordance with any preceding example of the memory device, in one example, N is 256 bits. In accordance with any preceding example of the memory device, in one example, M is 32.

In general with respect to the descriptions herein, in one example a system including: a memory device coupled to a memory controller, the memory controller including a scheduler to schedule the read command with other commands based on the memory device to send data as a first transfer and a second transfer; wherein the memory device comprises a memory device in accordance with any example of the preceding two paragraphs.

In general with respect to the descriptions herein, in one example a memory controller includes: a data interface to couple to a memory device, to receive N data bits over a burst length M in response to a read command; a command interface to couple to the memory device, to send the read command to the memory device to read a selected bank of multiple banks of the memory device, wherein read access to the selected bank by the memory device is to access N/2 data bits from the selected bank, wherein the memory device is to perform two read accesses to the selected bank to access the N data bits; and a scheduler to schedule the read command with other commands based on the memory device to send data to the data interface as a first transfer of burst length M/2 of a first N/2 data bit portion and a second transfer of burst length M/2 of a second N/2 data bit portion.

In one example of the memory controller, the scheduler is to schedule the read command with other commands based on the memory device to send the first transfer as soon as the first N/2 data bit portion is accessed from the selected bank, and to send the second transfer after a delay, as soon as the second N/2 data bit portion is accessed from the selected bank. In accordance with any preceding example of the memory controller, in one example, the scheduler is to schedule the read command with other commands based on the memory device to extend a delay between the first transfer and the second transfer to a period greater than a tCCD_L delay. In accordance with any preceding example of the memory controller, in one example, the scheduler is to schedule the read command with other commands based on the memory device to delay the first transfer to send the first transfer and the second transfer consecutively without delay between the first transfer and the second transfer. In accordance with any preceding example of the memory controller, in one example, the scheduler is to schedule the read command with other commands based on the memory device to delay the first transfer to leave a transfer window between the first transfer and the second transfer; and wherein the memory controller is to schedule another read command to another of the multiple banks to interleave a third N/2 data bit portion between the first transfer and the second transfer. In accordance with any preceding example of the memory controller, in one example, the scheduler is to schedule a second read command to the selected bank to trigger two consecutive read accesses by the memory device. In accordance with any preceding example of the memory controller, in one example, the memory device comprises a dynamic random access memory (DRAM) device compatible with a low power double data rate (LPDDR) standard. In accordance with any preceding example of the memory controller, in one example, N is 256 bits. In accordance with any preceding example of the memory controller, in one example, M is 32.

In general with respect to the descriptions herein, in one example a system including: a memory device coupled to a memory controller, the memory device including a memory array having multiple banks, including a selected bank selected for read access for a read command from the memory controller, wherein the read access to the selected bank is to access N/2 data bits from the selected bank; and control hardware, wherein in response to the read command, the control hardware is to trigger two read accesses to the selected bank to access N data bits from the selected bank; wherein the memory device is to send data as a first transfer of burst length M/2 of a first N/2 data bit portion and a second transfer of burst length M/2 of a second N/2 data bit portion; wherein the memory controller comprises a memory controller in accordance with any example of the preceding two paragraphs.

In general with respect to the descriptions herein, in one example a method includes: receiving a read command for a selected bank of a memory device from a memory controller, wherein the memory device is to transfer N data bits over a burst length M, wherein a read access to the selected bank is to access N/2 data bits from the selected bank; in response to the read command, triggering two read accesses to the selected bank to access N data bits from the selected bank; and sending data as a first transfer of burst length M/2 of a first N/2 data bit portion and a second transfer of burst length M/2 of a second N/2 data bit portion.

In one example of the method, the control hardware is to cause the hardware interface to sending data as the first transfer comprises sending the first transfer as soon as the first N/2 data bit portion is accessed from the selected bank, and sending the second transfer after a delay, as soon as the second N/2 data bit portion is accessed from the selected bank. In accordance with any preceding example of the method, in one example, the sending data comprises delaying the transfer prior to sending the second transfer, extending a delay between the first transfer and the second transfer to a period greater than a tCCD_L delay. In accordance with any preceding example of the method, in one example, the sending data comprises delaying the first transfer prior to sending the first transfer. In accordance with any preceding example of the method, in one example, the delay comprises a delay of the first transfer to send the first transfer and the second transfer consecutively without delay between the first transfer and the second transfer. In accordance with any preceding example of the method, in one example, the delay comprises a delay of the first transfer to leave a transfer window between the first transfer and the second transfer, to interleave a third N/2 data bit portion from another of the multiple banks between the first transfer and the second transfer. In accordance with any preceding example of the method, in one example, the method further includes: buffering the first N/2 data bit portion for the delay. In accordance with any preceding example of the method, in one example, the control hardware is to generate two internal read access operations for the selected bank in response to the read command from the memory controller. In accordance with any preceding example of the method, in one example, the memory device comprises a dynamic random access memory (DRAM) device compatible with a low power double data rate (LPDDR) standard. In accordance with any preceding example of the method, in one example, N is 256 bits. In accordance with any preceding example of the method, in one example, M is 32.

In general with respect to the descriptions herein, in one example a method includes: sending a read command from a memory controller to a memory device to read a selected bank of multiple banks of the memory device, wherein read access to the selected bank by the memory device is to access N/2 data bits from the selected bank, wherein the memory device is to perform two read accesses to the selected bank to access the N data bits; scheduling the read command with other commands based on the memory device to send data to the data interface as a first transfer of burst length M/2 of a first N/2 data bit portion and a second transfer of burst length M/2 of a second N/2 data bit portion; and receiving N data bits over a burst length M in response to the read command.

In one example of the method, the scheduling comprises scheduling the read command with other commands based on the memory device to send the first transfer as soon as the first N/2 data bit portion is accessed from the selected bank, and to send the second transfer after a delay, as soon as the second N/2 data bit portion is accessed from the selected bank. In accordance with any preceding example of the method, in one example, the scheduling comprises scheduling the read command with other commands based on the memory device to extend a delay between the first transfer and the second transfer to a period greater than a tCCD_L delay. In accordance with any preceding example of the method, in one example, the scheduling comprises scheduling the read command with other commands based on the memory device to delay the first transfer to send the first transfer and the second transfer consecutively without delay between the first transfer and the second transfer. In accordance with any preceding example of the method, in one example, the scheduling comprises scheduling the read command with other commands based on the memory device to delay the first transfer to leave a transfer window between the first transfer and the second transfer; and scheduling another read command to another of the multiple banks to interleave a third N/2 data bit portion between the first transfer and the second transfer. In accordance with any preceding example of the method, in one example, the scheduling comprises scheduling a second read command to the selected bank to trigger two consecutive read accesses by the memory device. In accordance with any preceding example of the method, in one example, the memory device comprises a dynamic random access memory (DRAM) device compatible with a low power double data rate (LPDDR) standard. In accordance with any preceding example of the method, in one example, N is 256 bits. In accordance with any preceding example of the method, in one example, M is 32.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device, comprising:
    a hardware interface to couple to a memory controller, wherein in response to a read command from the memory controller, the hardware interface is to transfer N data bits over a burst length M;
    a memory array having multiple banks, including a selected bank selected for read access for the read command, wherein the read access to the selected bank is to access N/2 data bits from the selected bank; and
    control hardware, wherein in response to the read command, the control hardware is to trigger two consecutive read accesses to the selected bank to access N data bits from the selected bank, a first read access to fetch a first N/2 data bit portion and a second read access to fetch a second N/2 data bit portion, and cause the hardware interface to send data as a first transfer of burst length M/2 of the first N/2 data bit portion and a second transfer of burst length M/2 of the second N/2 data bit portion.

2. The memory device of claim 1, wherein the control hardware is to cause the hardware interface to send the first transfer as soon as the first N/2 data bit portion is accessed from the selected bank, and to send the second transfer after a delay, as soon as the second N/2 data bit portion is accessed from the selected bank.

3. The memory device of claim 1, wherein the control hardware is to delay the transfer prior to sending the second transfer, to extend a delay between the first transfer and the second transfer to a period greater than a tCCD_L delay.

4. The memory device of claim 1, wherein the control hardware is to delay the first transfer prior to sending the first transfer.

5. The memory device of claim 4, wherein the delay comprises a delay of the first transfer to send the first transfer and the second transfer consecutively without delay between the first transfer and the second transfer.

6. The memory device of claim 4, wherein the delay comprises a delay of the first transfer to leave a transfer window between the first transfer and the second transfer, to interleave a third N/2 data bit portion from another of the multiple banks between the first transfer and the second transfer.

7. The memory device of claim 4, further comprising:
    a buffer to hold the first N/2 data bit portion for the delay.

8. The memory device of claim 1, wherein the control hardware is to generate two internal read access operations for the selected bank in response to the read command from the memory controller.

9. The memory device of claim 1, wherein the memory device comprises a dynamic random access memory (DRAM) device compatible with a low power double data rate (LPDDR) standard.

10. The memory device of claim 9, wherein N is 256 bits.

11. The memory device of claim 9, wherein M is 32.

12. A memory controller, comprising:
    a data interface to couple to a memory device, to receive N data bits over a burst length M in response to a read command;
    a command interface to couple to the memory device, to send the read command to the memory device to read a selected bank of multiple banks of the memory device, wherein read access to the selected bank by the memory device is to access N/2 data bits from the selected bank, wherein the memory device is to perform two consecutive read accesses to the selected bank to access N data bits from the selected bank, a first read access to fetch a first N/2 data bit portion and a second read access to fetch a second N/2 data bit portion; and
    a scheduler to schedule the read command with other commands based on the memory device to send data to the data interface as a first transfer of burst length M/2 of the first N/2 data bit portion and a second transfer of burst length M/2 of the second N/2 data bit portion.

13. The memory controller of claim 12, wherein the scheduler is to schedule the read command with other commands based on the memory device to send the first transfer as soon as the first N/2 data bit portion is accessed from the selected bank, and to send the second transfer after a delay, as soon as the second N/2 data bit portion is accessed from the selected bank.

14. The memory controller of claim 12, wherein the scheduler is to schedule the read command with other commands based on the memory device to extend a delay between the first transfer and the second transfer to a period greater than a tCCD_L delay.

15. The memory controller of claim 12, wherein the scheduler is to schedule the read command with other commands based on the memory device to delay the first transfer to send the first transfer and the second transfer consecutively without delay between the first transfer and the second transfer.

16. The memory controller of claim 12, wherein the scheduler is to schedule the read command with other commands based on the memory device to delay the first transfer to leave a transfer window between the first transfer and the second transfer; and
wherein the memory controller is to schedule another read command to another of the multiple banks to interleave a third N/2 data bit portion between the first transfer and the second transfer.

17. The memory controller of claim 12, wherein the scheduler is to schedule a second read command to the selected bank to trigger two consecutive read accesses by the memory device.

18. The memory controller of claim 12, wherein the memory device comprises a dynamic random access memory (DRAM) device compatible with a low power double data rate (LPDDR) standard.

19. The memory controller of claim 18, wherein N is 256 bits and M is 32.

20. A system, comprising:
a memory device coupled to a memory controller, the memory device and the memory controller to exchange N data bits over a burst length M, the memory device including
a memory array having multiple banks, including a selected bank selected for read access for a read command from the memory controller, wherein the read access to the selected bank is to access N/2 data bits from the selected bank; and
control hardware, wherein in response to the read command, the control hardware is to trigger two consecutive read accesses to the selected bank to access N data bits from the selected bank, a first read access to fetch a first N/2 data bit portion and a second read access to fetch a second N/2 data bit portion;
wherein the memory device is to send data as a first transfer of burst length M/2 of the first N/2 data bit portion and a second transfer of burst length M/2 of the second N/2 data bit portion; and
the memory controller including
a scheduler to schedule the read command with other commands based on the memory device to send data as the first transfer and the second transfer.

21. The system of claim 20, wherein the memory device is to send the first transfer as soon as the first N/2 data bit portion is accessed from the selected bank, and to send the second transfer after a delay, as soon as the second N/2 data bit portion is accessed from the selected bank.

22. The system of claim 20, wherein the memory device is to delay the transfer prior to sending the second transfer, to extend a delay between the first transfer and the second transfer to a period greater than a tCCD_L delay.

23. The system of claim 20, wherein the memory device further includes:
a buffer to hold the first N/2 data bit portion for a delay of the first transfer prior to sending the first transfer;
wherein the delay comprises a delay of the first transfer to send the first transfer and the second transfer consecutively without delay between the first transfer and the second transfer.

24. The system of claim 20, wherein the memory device further includes:
a buffer to hold the first N/2 data bit portion for a delay of the first transfer prior to sending the first transfer;
wherein the delay comprises a delay of the first transfer to leave a transfer window between the first transfer and the second transfer, to interleave a third N/2 data bit portion from another of the multiple banks between the first transfer and the second transfer.

* * * * *